(12) United States Patent  
Osakabe

(10) Patent No.: US 6,279,649 B1  
(45) Date of Patent: Aug. 28, 2001

(54) COOLING APPARATUS USING BOILING AND CONDENSING REFRIGERANT

(75) Inventor: Hiroyuki Osakabe, Chita-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/299,243

(22) Filed: Apr. 23, 1999

(30) Foreign Application Priority Data

Apr. 27, 1998 (JP) ................................................. 10-117008  
Aug. 20, 1998 (JP) ................................................. 10-233784

(51) Int. Cl.[7] ..................................................... F28D 15/00
(52) U.S. Cl. .............................. 165/104.33; 165/104.21; 361/700; 257/715
(58) Field of Search ........................... 165/80.4, 104.33, 165/185, 104.21; 361/700; 257/715

(56) References Cited

U.S. PATENT DOCUMENTS

| | | | |
|---|---|---|---|
| 4,949,164 | * 8/1990 | Ohashi et al. | 165/104.33 X |
| 5,832,989 | 11/1998 | Osakabe et al. | |
| 6,119,767 | * 9/2000 | Kadota et al. | 165/80.3 X |

FOREIGN PATENT DOCUMENTS

| | | | |
|---|---|---|---|
| 0152150 | * 9/1982 | (JP) | 165/104.33 |
| 0083184 | * 5/1983 | (JP) | 165/104.33 |
| 0131755 | * 8/1983 | (JP) | 165/104.33 |
| 409205167 | * 8/1997 | (JP) . | |

* cited by examiner

*Primary Examiner*—Christopher Atkinson  
(74) *Attorney, Agent, or Firm*—Harness, Dickey & Pierce, PLC

(57) ABSTRACT

A cooling apparatus includes a refrigerant tank having a surface to which heating devices are attached and containing liquid refrigerant which is boiled and evaporated by heat transferred from the heating devices. The refrigerant tank includes a refrigerant chamber, a condensed liquid passage, heat insulating passage, and a communication passage. The heat insulating passage is formed between the condensed liquid passage and the refrigerant chamber. A vapor reverse flow reducing plate having a small hole is provided at the bottom of a lower opening of the heat insulating passage to reduce vaporized refrigerant (bubble) flowing into the refrigerant chamber from the heat insulated passage. Accordingly, the movement of the bubbles from the heat insulating passage to the refrigerant chamber via the communication passage is suppressed, and the heat radiation performance is improved.

4 Claims, 25 Drawing Sheets

US 6,279,649 B1

COOLING APPARATUS USING BOILING AND CONDENSING REFRIGERANT

CROSS REFERENCE TO RELATED APPLICATIONS

This application is based on and claims priority of Japanese Patent Application Nos. Hei. 10-117008 filed on Apr. 27, 1998, and Hei. 10-233784 filed on Aug. 20, 1998, the contents of which are incorporated herein by reference.

BACKGROUND OF THE INVENTION

1. Field of the Invention

The present invention relates to a cooling apparatus using boiling and condensing refrigerant, capable of cooling an exothermic body by heat radiation caused by repetitive boiling and condensing refrigerant.

2. Description of Related Art

One type of related cooling apparatus using boiling and condensing refrigerant is disclosed in U.S. patent application Ser. No. 08/790,015.

According to this related art, a heat insulating passage 110 is formed inside a refrigerant tank 100 as shown in FIG. 30. The heat insulating passage 110 is formed between a vapor passage 120 and a condensed liquid passage 130 to reduce the amount of heat transferred from an exothermic body through the vapor passage 120 to the liquid refrigerant in the condensed liquid passage 130. Accordingly, boiling of the refrigerant in the condensed liquid passage 130 is prevented, and the condensed liquid refrigerant in the condensed liquid passage 130 sent from a radiator can be stably supplied to the vapor passage 120.

According to the above related apparatus, however, if the temperature of the exothermic body increases, a part of the bubbles generated in the heat insulating passage 110 may flow back (return) to the vapor passage 120 via a communication passage 140. Accordingly, the boiling refrigerant surface in the vapor passage 120 may be filled with more bubbles, and the radiation performance of the apparatus may be compromised.

Furthermore, according to the above related apparatus, the refrigerant tank 100 is formed by an extruded material, and an extruded support wall 150 divides the refrigerant tank 100 into the vapor passage 120 and the condensed liquid passage 130. Further, in order to form the heat insulating passage 110, an extra support wall 160 is extruded. Thus, the extrusion performance may be compromised because a cross section of the refrigerant tank 100 is asymmetric. If another extra support wall to add an extra heat insulating passage is formed to make the refrigerant tank 100 symmetric, the apparatus may be increased in size by the extra heat insulating passage.

SUMMARY OF THE INVENTION

The present invention is made in light of the foregoing problems, and it is an object of the present invention to provide a cooling apparatus which can improve the radiating performance by reducing the reverse flow of the bubble (vaporized refrigerant) from the heat insulating passage to the vapor passage (refrigerant chamber) via the communication passage.

Another object of the present invention is to provide a cooling apparatus which can prevent the boiling of the refrigerant in the condensed liquid passage without compromising the extrusion performance and without increasing the size of the apparatus.

According to a first aspect of the present invention, a refrigerant tank has a refrigerant chamber in which liquid refrigerant is vaporized by receiving heat transmitted from an exothermic device, a condensed liquid passage in which condensed refrigerant flows, a heat insulating passage provided between the refrigerant chamber and the condensed liquid passage for reducing heat transmission from the refrigerant chamber to the condensed liquid passage, and a communication passage provided at a bottom of the refrigerant tank for communicating the refrigerant chamber, the condensed liquid passage, and the heat insulating passage. A vapor reverse flow reducing member is provided between the heat insulating passage and the communication passage for reducing a flow of the gaseous refrigerant from the heat insulating passage to the communication passage.

Accordingly, the vaporized gaseous refrigerant generated in the heat insulating passage is prevented from entering the refrigerant chamber via the communication passage. Thus, the bubble at a boiling surface in the refrigerant chamber is reduced, and the heat radiation performance is improved.

According to another aspect of the present invention, a refrigerant tank has a refrigerant chamber in which liquid refrigerant is vaporized by receiving heat transmitted from an exothermic device, a condensed liquid passage in which condensed refrigerant flows, and a communication passage provided at a bottom of the refrigerant tank for communicating the refrigerant chamber and the condensed liquid passage. The condensed liquid passage includes a heat insulating passage therein for reducing heat transmission from the refrigerant chamber to the condensed liquid passage.

Accordingly, the boiling of the refrigerant in the condensed liquid passage is prevented without compromising the extrusion performance and without increasing the size of the apparatus.

BRIEF DESCRIPTION OF THE DRAWINGS

Other features and advantages of the present invention will be appreciated, as well as methods of operation and the function of the related parts, from a study of the following detailed description, the appended claims, and the drawings, all of which form a part of this application. In the drawings:

DETAILED DESCRIPTION OF PREFERRED EMBODIMENTS (First Embodiment)

Figure 1:
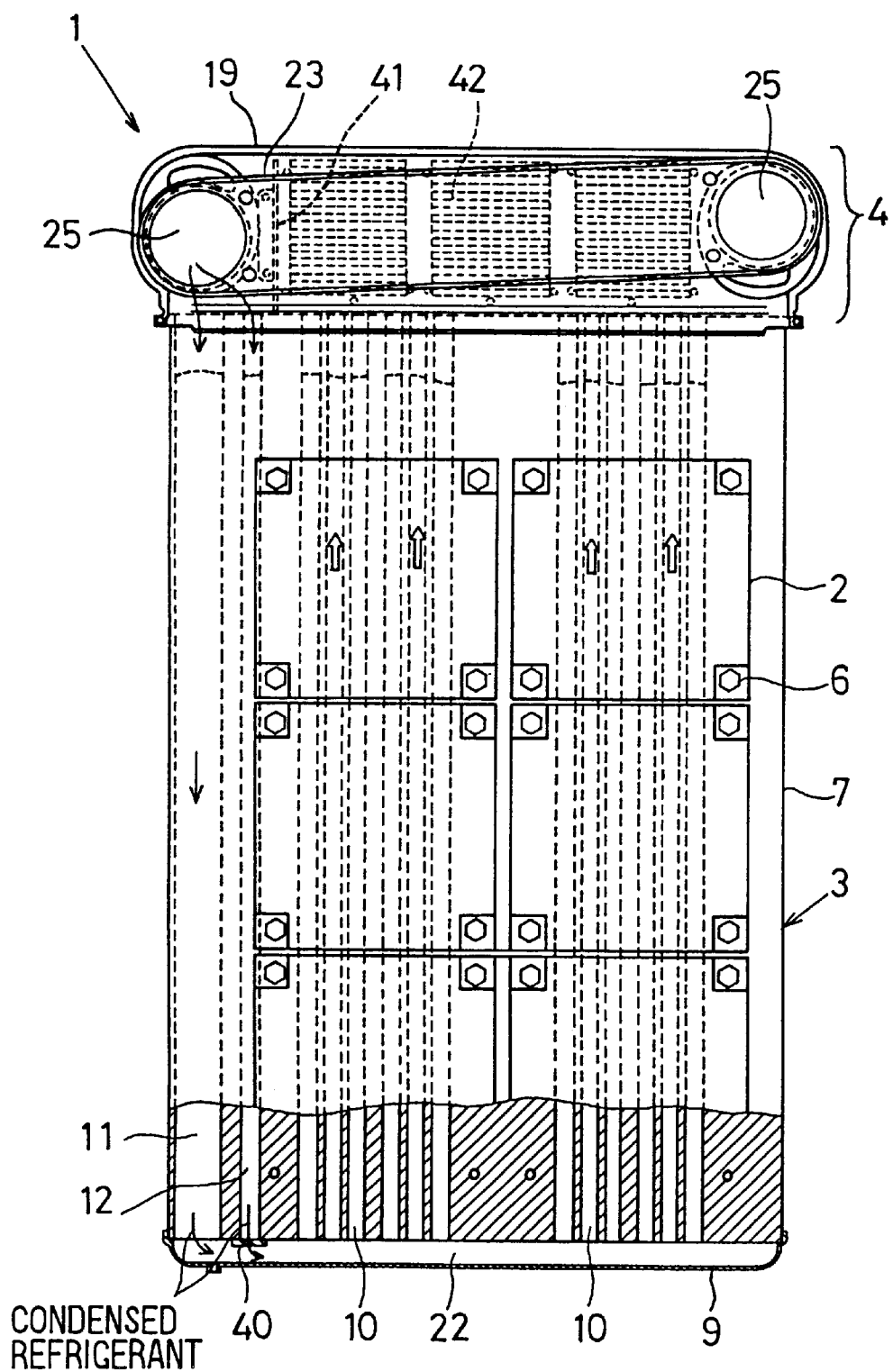
FIG. 1 is a front view of a cooling apparatus according to a first embodiment of the present invention.
Figure 2:
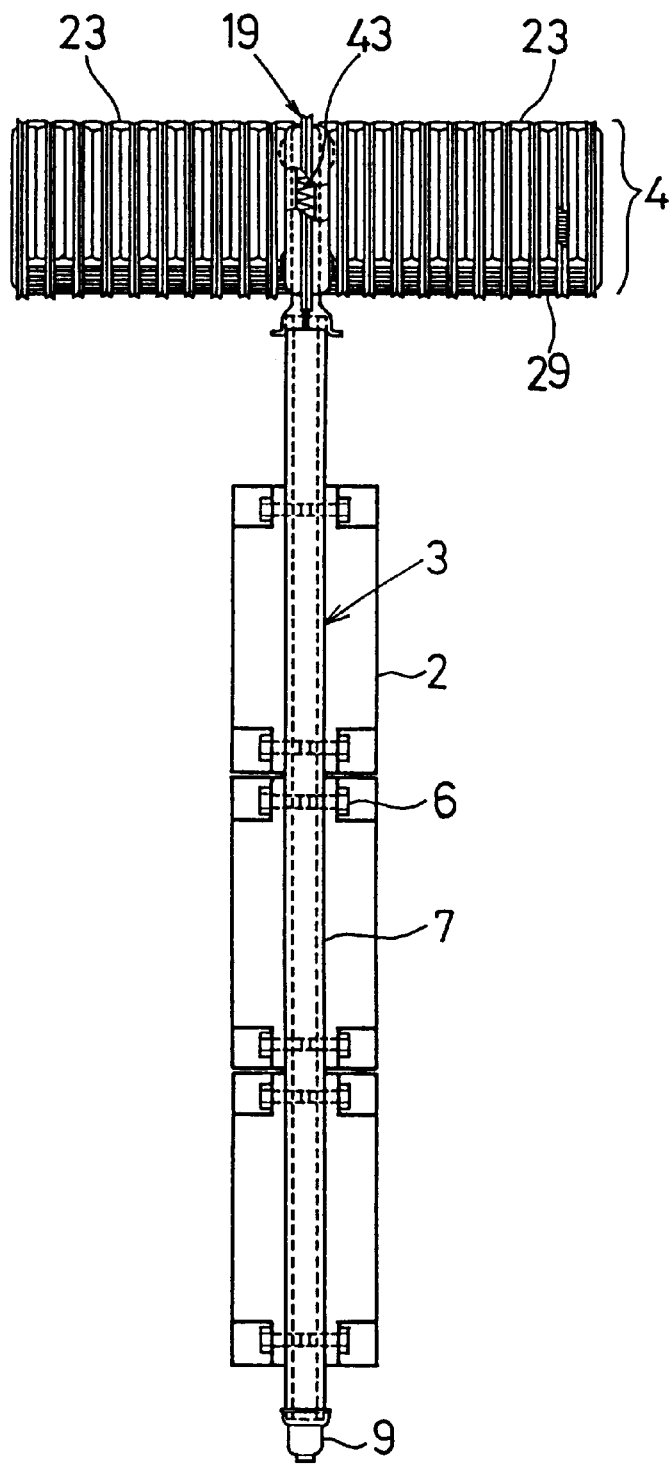
FIG. 2 is a side view of the cooling apparatus according to the first embodiment of the present invention.

A cooling apparatus 1 according to a first embodiment cools an exothermic body 2 by using boiling and condensation of the refrigerant. As shown in FIGS. 1 and 2, the cooling apparatus 1 includes a refrigerant tank 3 to store the liquid refrigerant therein and a radiator 4 installed in the upper portion of the refrigerant tank 3.

The exothermic body 2 is an IGBT module made up of, for example, an inverter circuit for an electric vehicle. Several IGBT modules are mounted on both surfaces of the refrigerant tank 3 with bolts 6.

The refrigerant tank 3 includes an extruded member 7 formed by extruding a metal having a high heat conductivity, such as aluminum, and an end cap 9 attached to lower end of the extruded member 7. The refrigerant tank 3 has a refrigerant chamber 10, a condensed liquid passage 11, a heat insulating passage 12, and a communication passage 22 therein.

Figure 3:
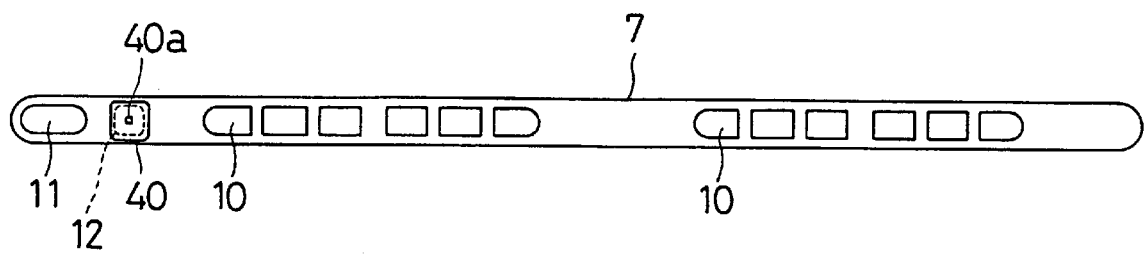
FIG. 3 is a bottom plan view of an extruded part 7 according to the first embodiment of the present invention.

As shown in FIG. 3, the extruded member 7 has a flat shape, and has several through holes to form the refrigerant chamber 10, condensed liquid passage 11, and heat insulating passage 12.

Figure 4:
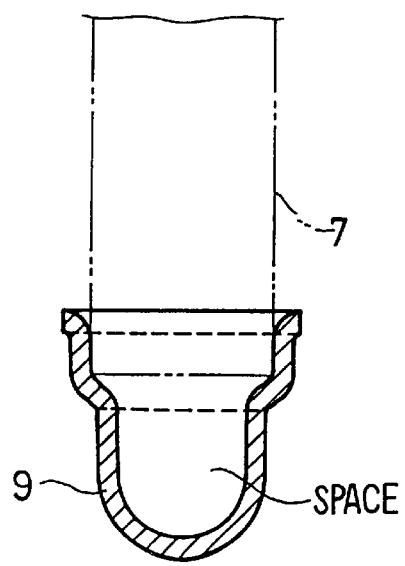
FIG. 4 is a cross section of an end cap 9 according to the first embodiment of the present invention.

The end cap 9 is made of aluminum used for the extruded member 7, and is joined to the lower end of the extruded member 7 by brazing to close the lower end of the extruded member 7. As shown in FIG. 4, there is certain space between the inside of the end cap 9 and the lower end of the extruded member 7.

The refrigerant chamber 10 is divided into several passages to form a boil region in which the stored liquid refrigerant boils by receiving heat from the IGBT modules (the exothermic body) 2.

The condensed liquid passage 11 is provided at one side of the refrigerant tank 3 to receive condensed refrigerant condensed at the radiator 4.

The heat insulating passage 12, having a rectangular 10 mm by 11 mm size, is formed between the refrigerant chamber 10 and the condensed liquid passage 11 to reduce heat transmission from the exothermic body 2 to the condensed liquid passage 11.

The communication passage 22 is defined by the inner space of the end cap 9 to supply the condensed refrigerant in the condensed liquid passage 11 to the refrigerant chamber 10 and the heat insulating passage 12. The condensed liquid passage 11, heat insulating passage 12 and the refrigerant chamber 10 communicate each other via the communication passage 22 at the lower end of the refrigerant tank 3.

Figure 5:
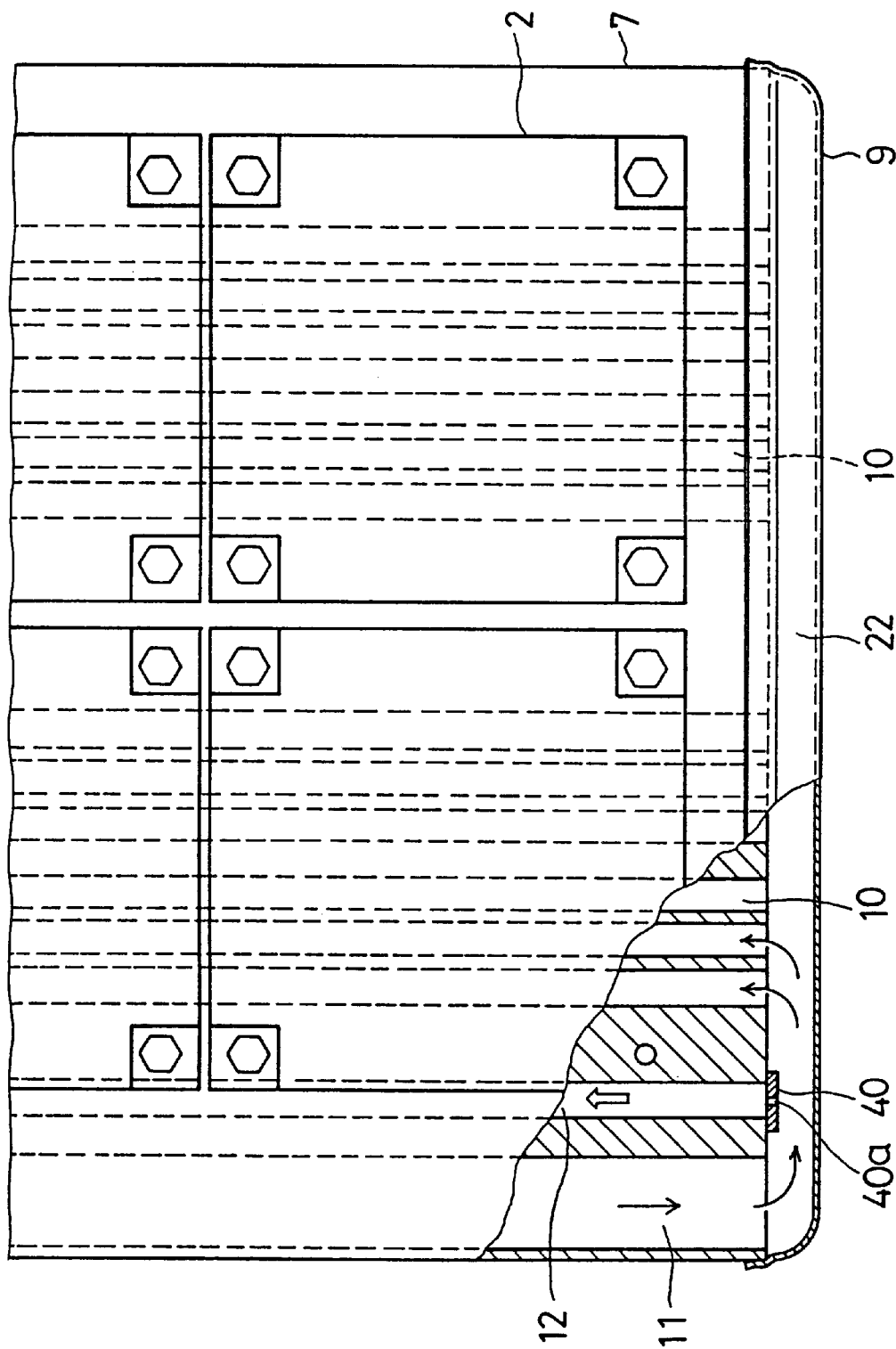
FIG. 5 is a part of an enlarged partially sectional view of a refrigerant tank 3 according to the first embodiment of the present invention.

As shown in FIG. 5, a vapor reverse flow reducing plate 40, for preventing vaporized refrigerant (bubble) vaporized in the heat insulating passage 12 from flowing out to the communication passage 22 from the heat insulating passage 12, is provided at a lower end opening (a connecting part between the heat insulating passage 12 and the communication passage 22) of the heat insulating passage 12. The vapor reverse flow reducing plate 40 also has a small hole 40a having 3 mm to 7 mm diameter as shown in FIG. 3 such that the liquid refrigerant passes through the small hole 40a. The area of the small hole 40a is within a range between 20% and 80% of the area of the heat insulating passage 12. It is preferable to set it within a range between 40% and 60% of the area of the heat insulating passage 12. In short, the vapor reverse flow reducing plate 40 can be replaced by anything which prevents the reverse flow of the vaporized refrigerant (bubble) and through which the liquid refrigerant passes, such as a plate with several holes, a mesh, a net or the like.

The radiator 4 is a so-called drawn cap type heat exchanger. As shown in FIG. 2, the radiator 4 is made up of a connecting tube 19, a radiation pipe 23, and a radiation fin 29.

The radiator 4 is connected to the refrigerant tank 3 by the connecting tube 19 at the upper end of the refrigerant tank 3. The connecting tube 19 is formed by joining the peripheral edge portions of the two pressed plates. The connecting tube 19 has connecting ports 25 at both ends.

A partition plate 41 is provided inside the connecting tube 19 to divide the connecting tube 19 into first communication chamber which is right side of the partition plate 41 in FIG. 1 and second communication chamber which is left side of the partition plate 41 in FIG. 1.

The first communication chamber communicates with the refrigerant chamber 10 of the refrigerant tank 3. The second communication chamber communicates with the condensed liquid passage 11 and the heat insulating passage 12 of the refrigerant tank 3. Inner fins 42, made of aluminum or the like, are inserted into the first communication chamber.

The radiation pipe 23 is formed by joining the peripheral edge portions of the two pressed plates such that the radiation pipe 23 has a flat and hollow space therein. The radiation pipe 23 has connecting ports 25 at both ends. Inner fins 42 shown in FIG. 2, made of aluminum or the like, are inserted into the connecting tube 19.

Figure 6:
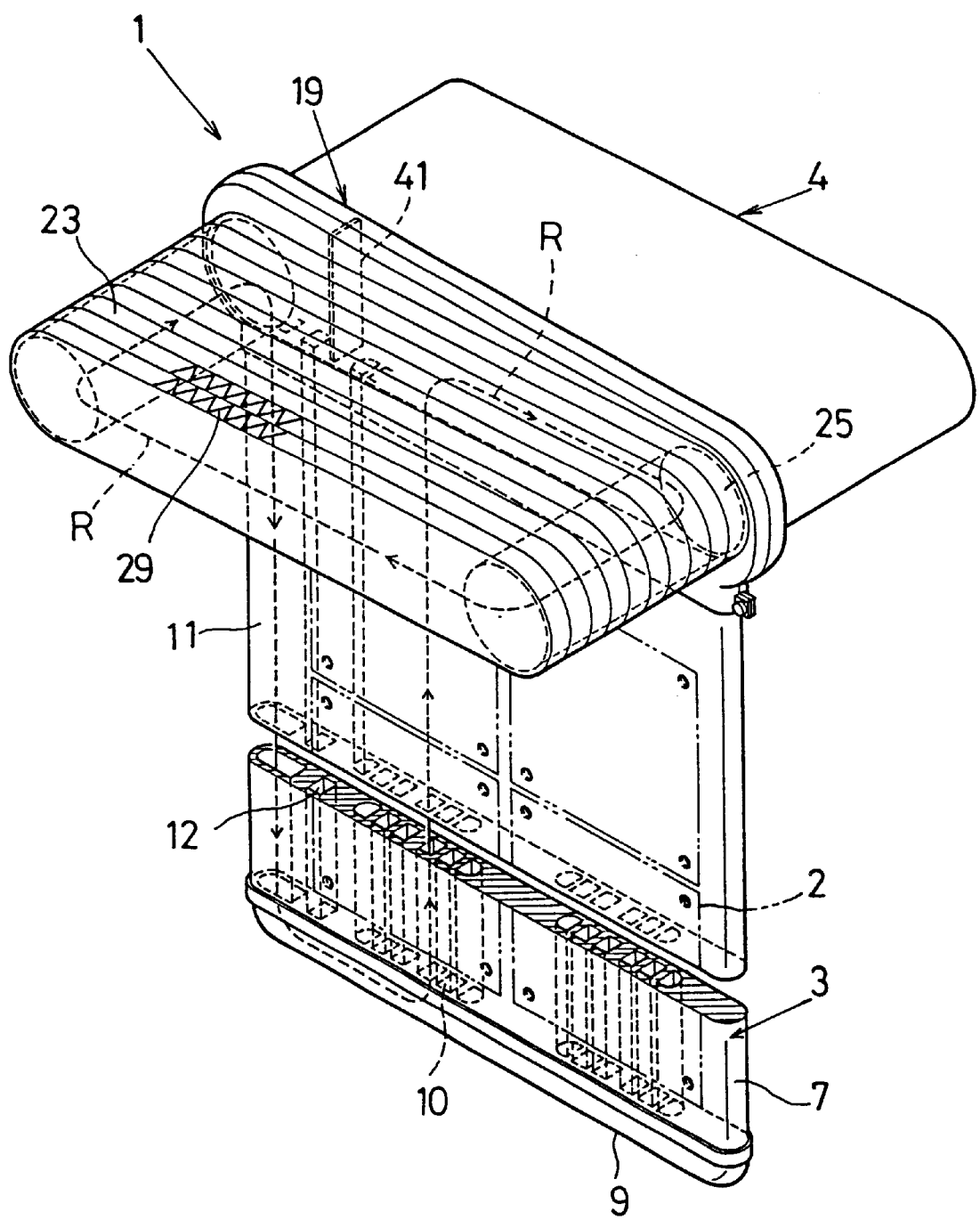
FIG. 6 is a perspective view of the cooling apparatus according to the first embodiment of the present invention.

As shown in FIGS. 2 and 6, a plurality of the radiation pipes 23 are stacked on both sides of the connecting tube 19, and are communicated each other via their connecting ports 25. As shown in FIG. 1, the radiation pipes 23 are attached to the connecting tube 19 with a small inclination.

The radiation fins 29 are made up of thin metal plates having a high thermal conductivity, such as aluminum, bent to form corrugated fins. The radiation fins 29 are disposed between the connecting tube 19 and the radiation pipe 23 and between each of the stacked radiation pipes 23, and are connected to surfaces of the connecting tube 19 and the radiation pipe 23 by brazing.

Operations of the first embodiment of the present invention will now be described.

The liquid refrigerant stored in the refrigerant chamber 10 is boiled by heat generated by and transferred from the exothermic body 2. As shown by an arrow R in FIG. 6, the boiled refrigerant turns into vapors, and ascends through the refrigerant chamber 10, and flows into the respective radiation pipes 23 via the first communication chamber of the connecting tube 19. The vaporized refrigerant flowed into the radiation pipes 23 is cooled by the heat exchange between the outside air and the vaporized refrigerant, and condenses on the inner surfaces of the radiation pipes 23 by releasing the latent heat. The latent heat released at the condensation of the vaporized refrigerant is transmitted to the radiation fins 29 from the radiation pipes 23, and is released to the outside air from the radiation fins 29.

The condensed refrigerant condensed in the radiation pipes 23 flows inside the radiation pipe 23 along the slope leftward in FIG. 1, and drops to the condensed liquid passage 11 and the heat insulating passage 12 via the second communication chamber of the connecting tube 19, and then, is supplied to the refrigerant chamber 10 from the condensed liquid passage 11 via the communication passage 22. If sufficient condensed refrigerant is not supplied to the heat insulating passage 12 from the radiator 4, additional condensed refrigerant is supplied to the heat insulating passage 12 from the communication passage 22.

According to the first embodiment of the present invention, the cooling apparatus 1 has the heat insulating passage 12 between the refrigerant chamber 10 and the condensed liquid passage 11 to reduce the heat transmission from the exothermic body 2 to the condensed liquid passage 11.

Furthermore, most of the heat transmission from the exothermic body 2 to the condensed liquid passage 11 is absorbed by the refrigerant in the heat insulating passage 12, and a part of the refrigerant in the heat insulating passage 12 is vaporized and returns to the radiator 4 to be condensed. As a result, the heat transmission from the exothermic body 2 to the condensed liquid passage 11 is greatly reduced compared with a conventional cooling apparatus which does not have the heat insulating passage 12.

Accordingly, the boiling of the refrigerant in the condensed liquid passage 11 is prevented, and the refrigerant circulates between the refrigerant tank 3 and the radiator 4 efficiently.

Furthermore, according to the first embodiment, the vapor reverse flow reducing plate 40 is provided at the lower end opening of the heat insulating passage 12 for preventing vaporized refrigerant (bubble) vaporized in the heat insulating passage 12 from flowing out to the communication passage 22 from the heat insulating passage 12. As a result, the vaporized refrigerant (bubble) generated in the heat insulating passage 12 is prevented from flowing into the refrigerant chamber 10. Accordingly, the heat radiation performance is not compromised even if the heating amount of the exothermic body 2 increases, and the heat radiation performance is improved.

Figure 7:
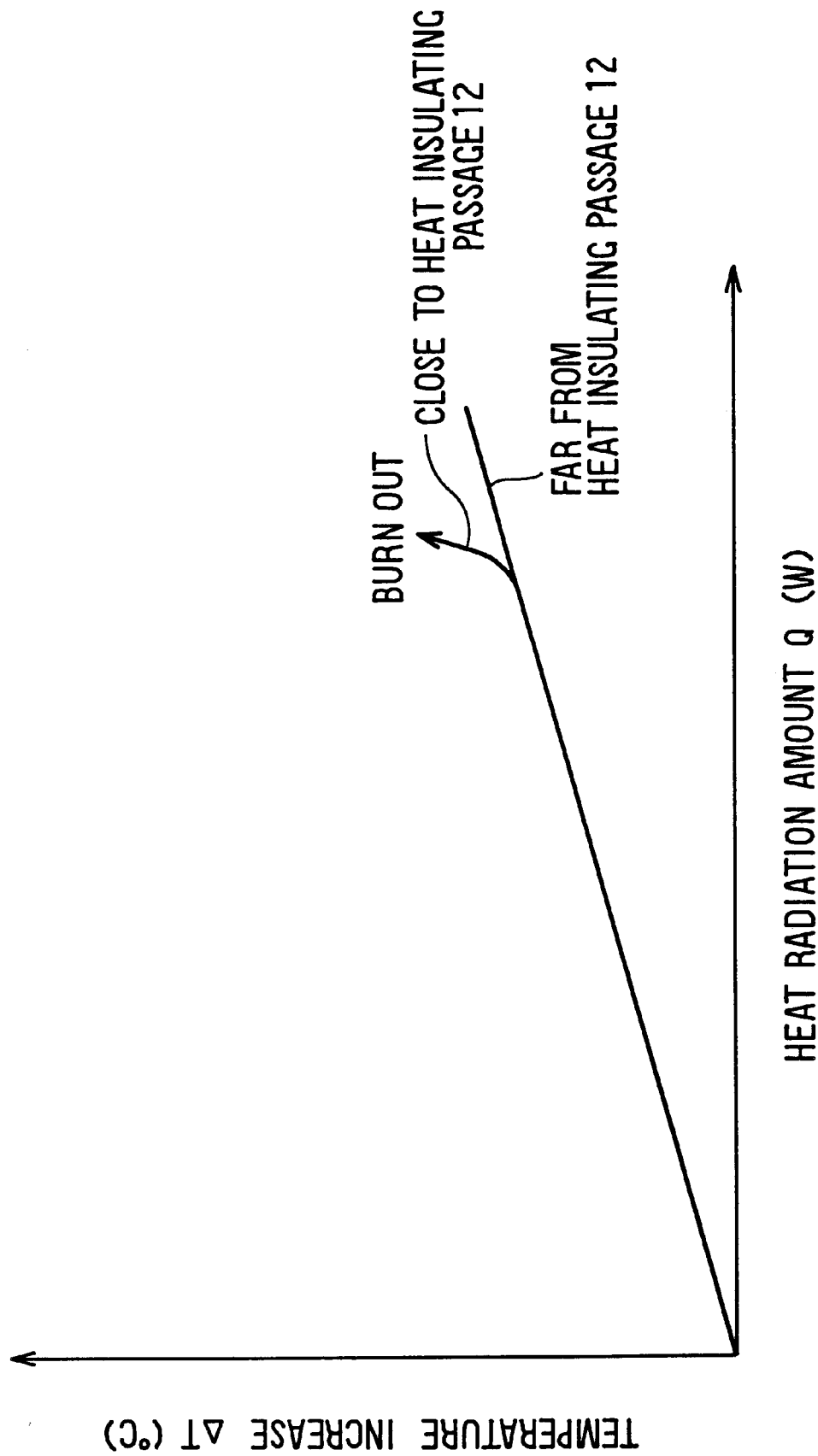
FIG. 7 is a graph showing a relationship between heat radiation amount Q and temperature increase $\Delta T$ at a mounting surface according to the first embodiment of the present invention.

Especially, the exothermic body 2 located closer to the heat insulating passage 12 is greatly affected by the reverse flow of the bubbles. In other words, if the bubbles in the heat insulating passage 12 flow into the refrigerant chamber 10, temperature at the IGBT module mounting surface closer to the heat insulating passage 12 increases more than that farther from the heat insulating passage 12, as shown in FIG. 7. Thus, according to the first embodiment, rapid temperature increase (=burn out) at the IGBT module mounting surface closer to the heat insulating passage 12 is prevented.

(Second Embodiment)

A second embodiment of the present invention is shown in FIGS. 8 to 11. In this and a third embodiments of the present invention, components which are substantially the same to those in previous embodiments are assigned the same reference numerals.

Figure 9:
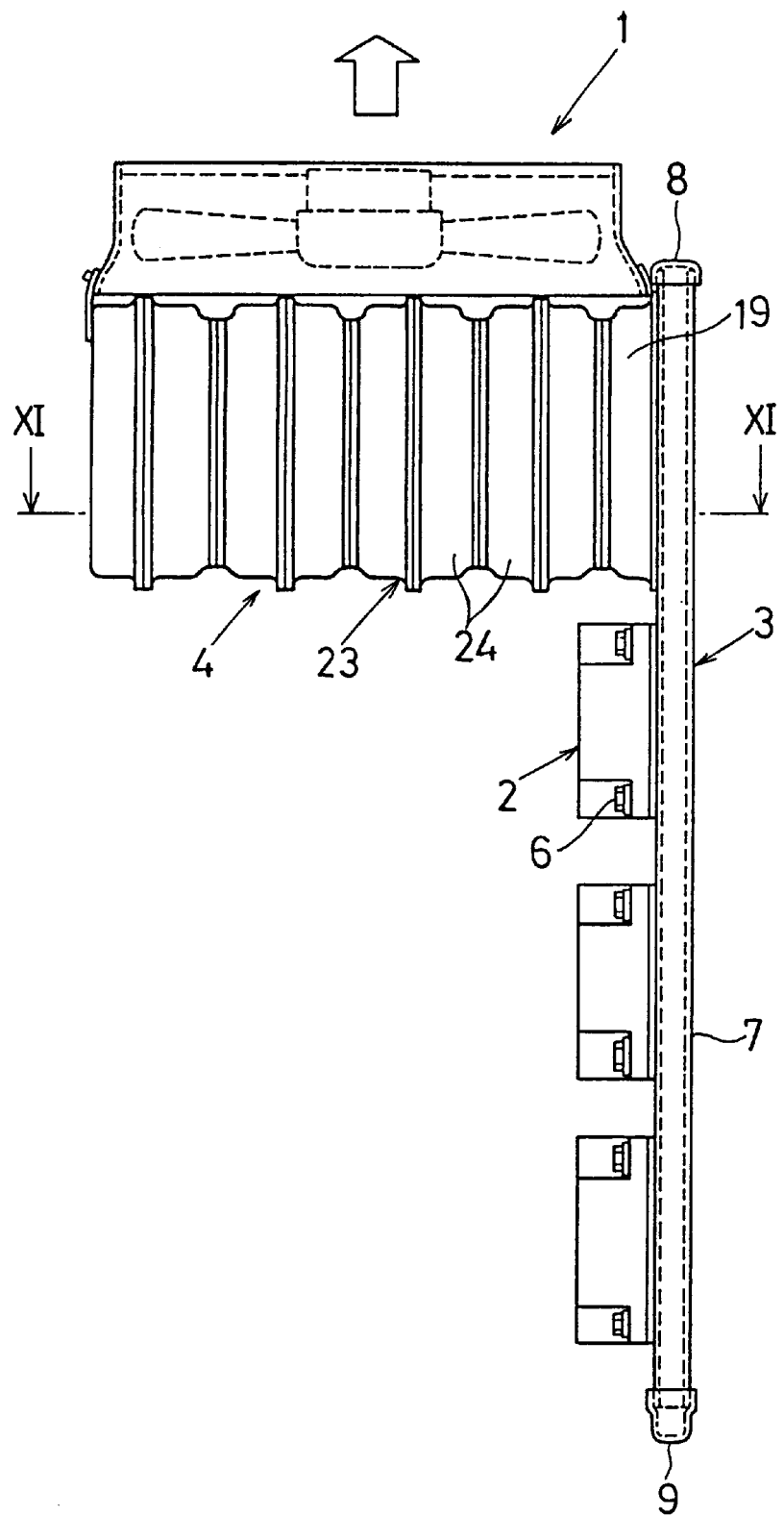
FIG. 9 is a side view of the cooling apparatus according to the second embodiment of the present invention.

As shown in FIG. 9, the radiator 4 is connected to one side of the upper portion of the refrigerant tank 3.

The refrigerant tank 3 includes the hollow extruded member 7 and end caps 8 and 9 attached to close upper and lower open ends of the extruded member 7 respectively.

Figure 10:
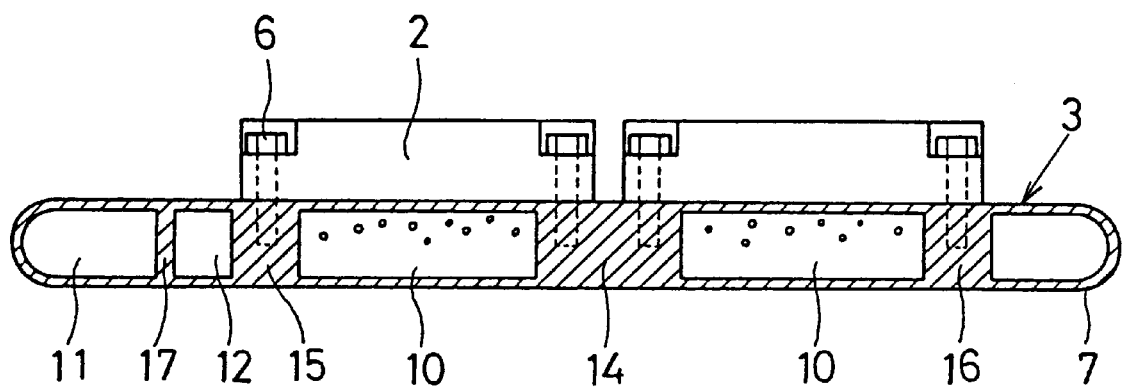
FIG. 10 is a cross sectional view taken along the line X—X of FIG. 8.

The extruded member 7 has a flat shape, and as shown in FIG. 10, it is partitioned by partition members 14, 15, 16 and 17 to form longitudinal through holes corresponding to the refrigerant chamber 10, condensed liquid passage 11 and heat insulating passage 12.

Figure 8:
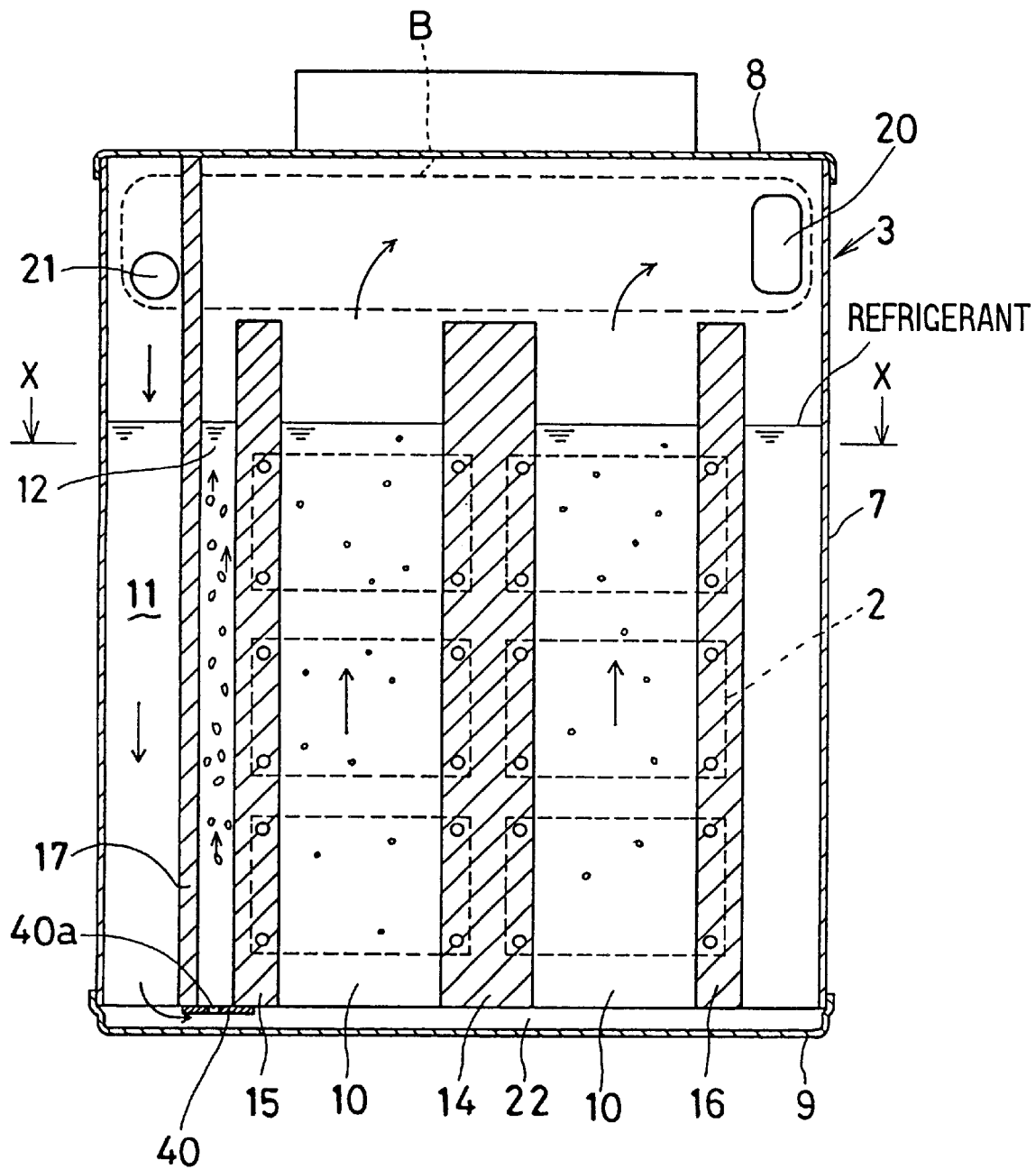
FIG. 8 is a longitudinal sectional view of a refrigerant tank according to a second embodiment of the present invention.

As shown in FIG. 8, an outlet opening 20 through which the vaporized refrigerant flows out and an inlet opening 21 through which the condensed refrigerant flows in are formed on an area to which the radiator 4 is connected (an area surrounded by the dotted line B) by a wall surface of the extruded member 7 on which the exothermic body 2 is mounted.

Since upper portions of the partition members 14, 15 and 16 are lower than the area B as shown in FIG. 8, the outlet opening 20 communicates with the refrigerant chamber 10 and the heat insulating passage 12. The inlet opening 21 communicates with the condensed liquid passage 11, and is isolated from the refrigerant chamber 10 and the heat insulating passage 12 by the partition member 17.

The end caps 8 and 9 are brazed to the upper and lower end openings of the extruded member 7 respectively. The upper end cap 8 is connected to the upper end opening of the extruded member 7 so as to close the upper open end of the extruded member 7. The lower end cap 9 is connected to the lower end opening of the extruded member 7 such that the communication passage 22 is formed between the lower end surface of the extruded member 7 and the lower end cap 9.

As shown in FIG. 8, the vapor reverse flow reducing plate 40 having a small hole 40a is provided at a lower end opening (a connecting part between the heat insulating passage 12 and the communication passage 22) of the heat insulating passage 12 in the same manner as the first embodiment.

Figure 11:
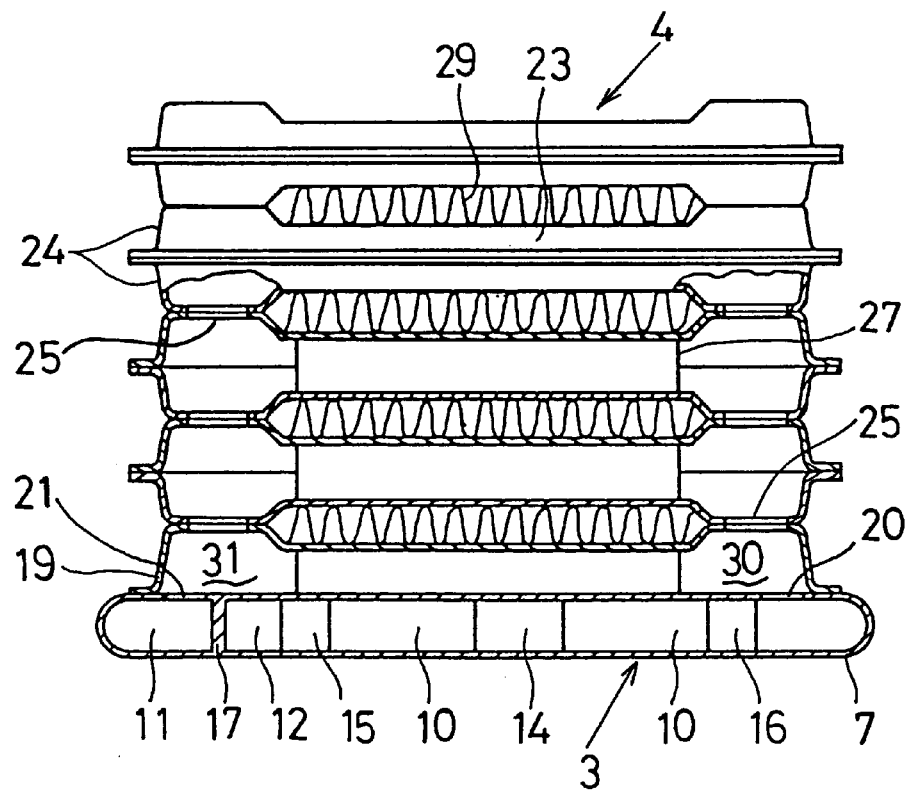
FIG. 11 is a cross sectional view taken along the line XI—XI of FIG. 9.

As shown in FIGS. 9 and 11, the radiator 4 is formed by stacking a plurality of hollow radiation pipes 23 and radiation fins 29. The radiator 4 is connected to the refrigerant tank 3 via a connecting plate 19.

The hollow radiation pipe 23 is formed by joining peripheral edges of a pair of pressed plates 24 as shown in FIG. 11. Each of the pair of pressed plates 24 is formed by pressing a metal having a high heat conductivity, such as aluminum, to have the same shape. Each of the pair of pressed plates 24 has connecting ports 25 at its both ends.

Aluminum-made inner fins 27 are inserted into the radiation pipes 23. Respective stacked radiation pipes 23 communicate each other via respective connecting ports 25. As shown in FIG. 11, the radiation fins 29 are placed between the stacked radiation pipes 23, and are connected to the surface of the radiation pipes 23 by brazing.

The connecting plate 19 is hermetically connected to the outer surface of the extruded member 7 so as to cover the inlet opening 21 and the outlet opening 20 of the extruded member 7. A communication chamber 30 communicates with the outlet opening 20 and another communication chamber 31 communicates with the inlet opening 21 are formed between the connecting plate 19 and the outer surface of the extruded member 7. The connecting ports 25 are formed at both ends of the connecting plate 19 in the same manner of the pressed plates 24 to communicate among the communication chambers 30, 31 and the radiation pipes 23 via the connecting ports 25.

Operations of the second embodiment of the present invention will now be described.

The liquid refrigerant stored in the refrigerant chamber 10 is boiled by heat generated by and transferred from the exothermic body 2. Most of the vaporized refrigerant ascends through the refrigerant chamber 10, and flows into the communication chamber via the outlet opening 20, and is distributed to respective radiation pipes 23 from the communication chamber 30. The vaporized refrigerant flows inside the radiation pipes 23 is cooled by the heat exchange between the outside air and the vaporized refrigerant, and condenses on the inner surfaces of the radiation pipes 23 by releasing the latent heat. The latent heat released at the condensation of the vaporized refrigerant is transmitted to the radiation fins 29 from the radiation pipes 23, and is released to the outside air from the radiation fins 29.

The condensed refrigerant condensed in the radiation pipes 23 flows inside the radiation pipe 23, and flows into the communication chamber 31. The condensed refrigerant stored in the communication chamber 31 flows into the condensed liquid passage 11 via the inlet opening 21, and is supplied to the refrigerant chamber 10 and the heat insulating passage 12 via the communication passage 22 inside the end cap 9.

According to the second embodiment of the present invention, the vapor reverse flow reducing plate 40 is provided at the lower end opening of the heat insulating passage 12 for preventing vaporized refrigerant (bubble) vaporized in the heat insulating passage 12 from flowing out to the communication passage 22 from the heat insulating passage 12. As a result, the vaporized refrigerant (bubble) generated in the heat insulating passage 12 is prevented from flowing into the refrigerant chamber 10. Accordingly, the heat radiation performance is not compromised even if the heating amount of the exothermic body 2 increases, and the heat radiation performance is improved.

(Third Embodiment)

Figure 12:
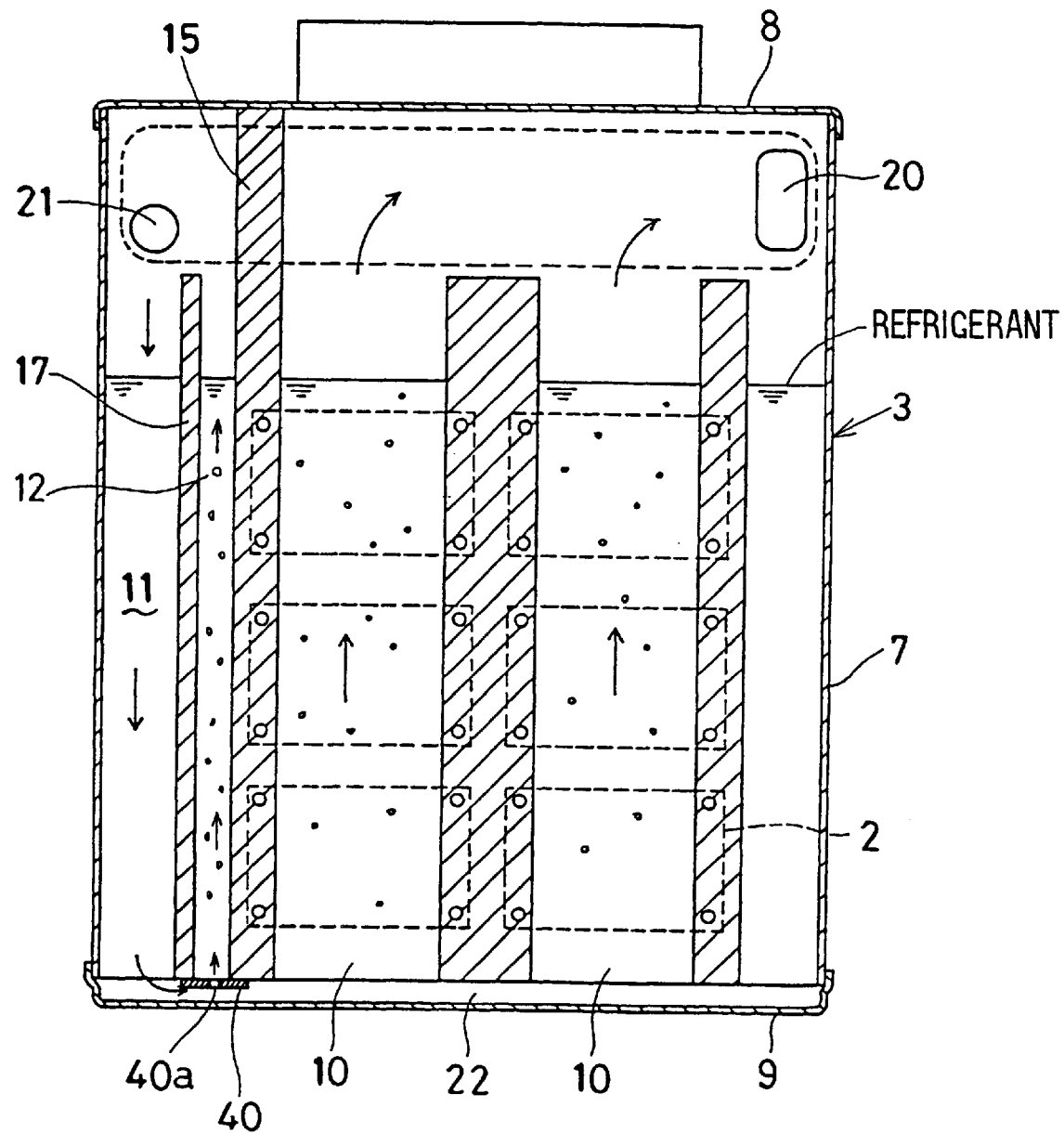
FIG. 12 is a longitudinal sectional view of a refrigerant tank according to a third embodiment of the present invention.

A third embodiment of the present invention will now be described with reference to FIG. 12.

In the third embodiment, the partition member 15 is extended to the upper end surface of the extruded member 7, and the partition member 17 is shortened, comparing to the second embodiment.

According to the third embodiment, the vapor reverse flow reducing plate 40 is provided at the lower end opening of the heat insulating passage 12 for preventing vaporized refrigerant (bubble) vaporized in the heat insulating passage 12 from flowing out to the communication passage 22 from the heat insulating passage 12. As a result, the vaporized refrigerant (bubble) generated in the heat insulating passage 12 is prevented from flowing into the refrigerant chamber 10. Accordingly, the heat radiation performance is not compromised even if the heating amount of the exothermic body 2 increases, and the heat radiation performance is improved.

(Fourth Embodiment)

A fourth embodiment of the present invention will now be described with reference to FIGS. 13 to 21C.

A cooling apparatus 201 according to the fourth embodiment cools IGBT modules 202 as high-temperature mediums, which constitute an inverter circuit included in an electric vehicle, a general electric power controller or the like. The cooling apparatus 201 includes a refrigerant tank 203, a connecting pipe 251, a radiator 204 and a cooling fan 205.

Figure 13:
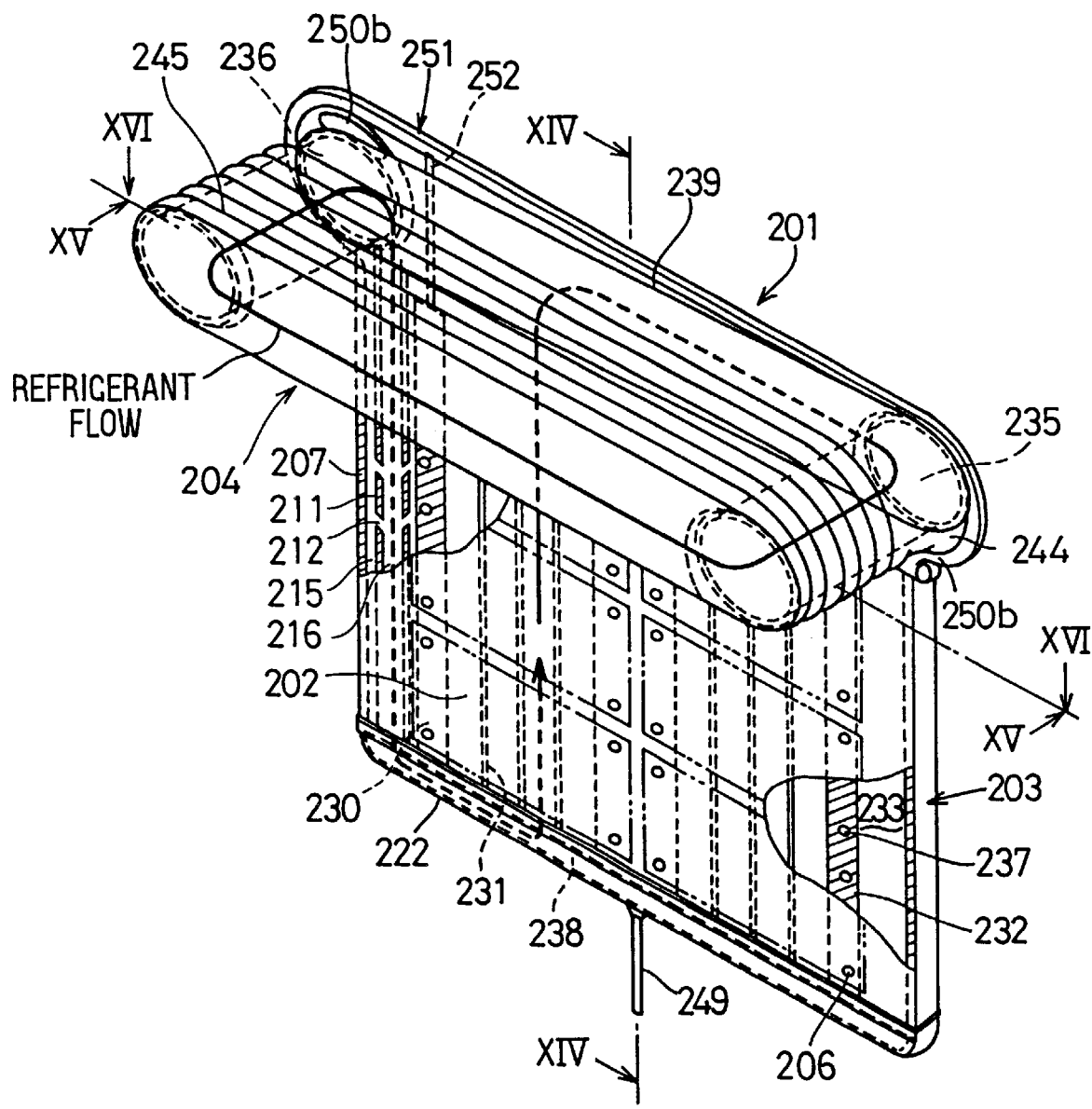
FIG. 13 is a perspective view of a cooling apparatus according to a fourth embodiment of the present invention.
Figure 14:
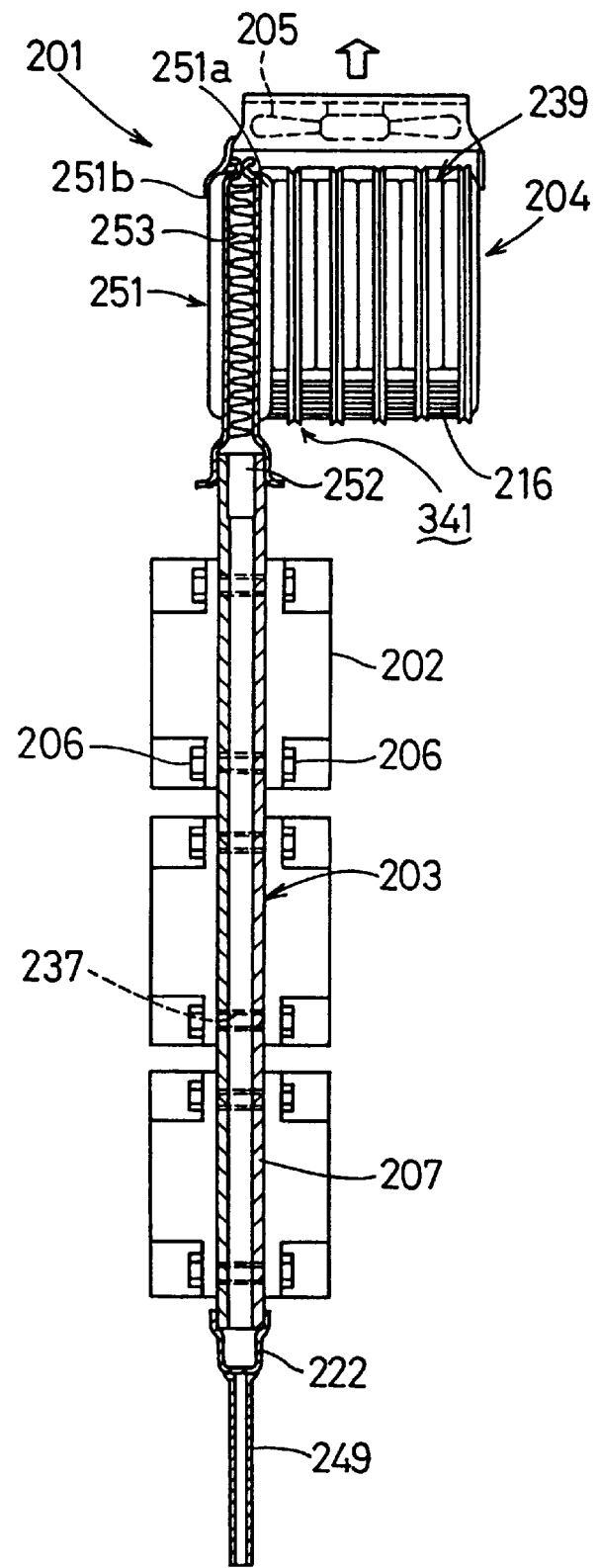
FIG. 14 is a sectional view of the cooling apparatus taken on the lines XIV—XIV in FIG. 13 according to the fourth embodiment of the present invention.

As shown in FIGS. 13 and 14, the IGBT modules 202 are fixed to the outer wall surface of the refrigerant tank 203 with bolts 206. Preferably, a heat-conductive grease is provided between the heat radiation plate of the IGBT module 202 and the outer wall surface of the refrigerant tank 203.

Figure 15:
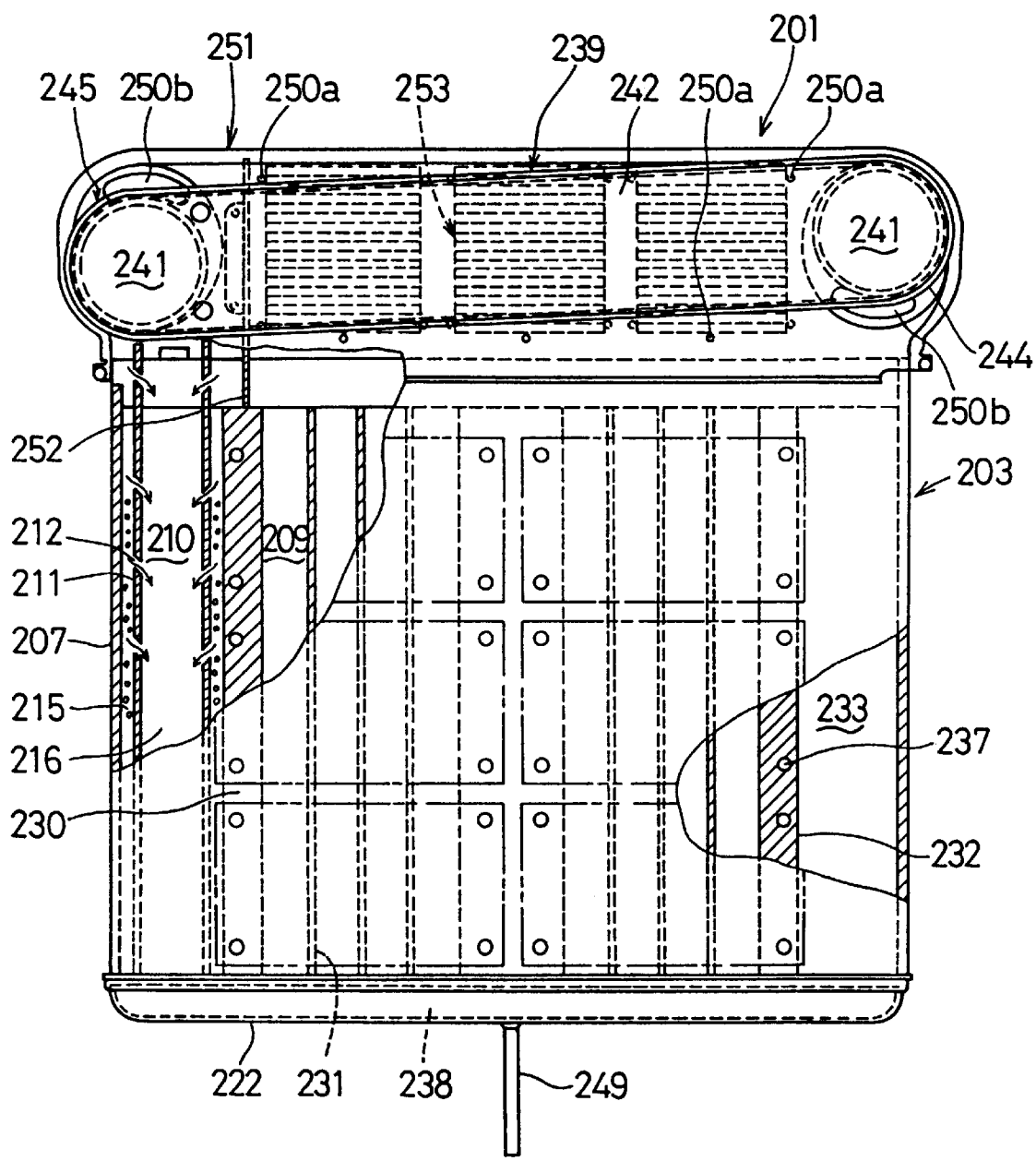
FIG. 15 is a sectional view of the cooling apparatus taken on the lines XV—XV in FIG. 13 according to the fourth embodiment of the present invention.

As shown in FIGS. 13 to 15, the refrigerant tank 203 includes a hollow extruded member 207 formed by extruding an aluminum block, and includes an end cap 222 attached to lower open end of the extruded member 207.

The extruded member 207 has a flat shape of a thickness being less than the width and the length of the wall thereof on which the IGBT modules 202 are mounted. The interior of the extruded member 207 is divided into vapor passages 209, a condensed liquid passage 210, and an inoperative passage 233, which pass through the extruded member 207 longitudinally, by partition walls 230, 231 and 232 extending vertically.

The partition walls 230, 231 and 232 are formed by thick portions of the extruded member 207. Internally threaded holes 237 to which the bolts 206 for mounting the IGBT modules 202 are screwed are formed in the partition walls 230, 231 and 232. The inoperative passage 233 is formed to be balanced with the condensed liquid passage 210 when the extruded member 207 is extruded, and such the inoperative passage 233 is not used as the condensed liquid passage. Therefore, it is not necessary to form the inoperative passage 233 if the cross section of the refrigerant tank 203 is symmetrical.

The aluminum-made end cap 222 is integrally brazed with the lower end periphery of the extruded member 207 so as to form a lower communicating passage 238 communicating the vapor passages 209, the condensed liquid passage 210 and the inoperative passage 233 of the extruded member 207 with each other.

To the end cap 222 attached a tube 249 for sealing refrigerant, through which the cooling apparatus 201 is cleaned, the refrigerant is supplied, and a degassing is performed. When degassing the cooling apparatus 201, the cooling apparatus 201 is turned over after filling the refrigerant therein, the radiator 204 is immersed in a hot water tank maintained to a temperature at which the saturated vapor pressure of the refrigerant is higher than the atmospheric pressure. Thus, the refrigerant within the cooling apparatus 201 is evaporated to release air, because the vaporized refrigerant has a specific gravity greater than air. After degassing, the tube 249 is crimped and sealed by welding or the like to seal the refrigerant in the cooling apparatus 201.

Figure 17A:
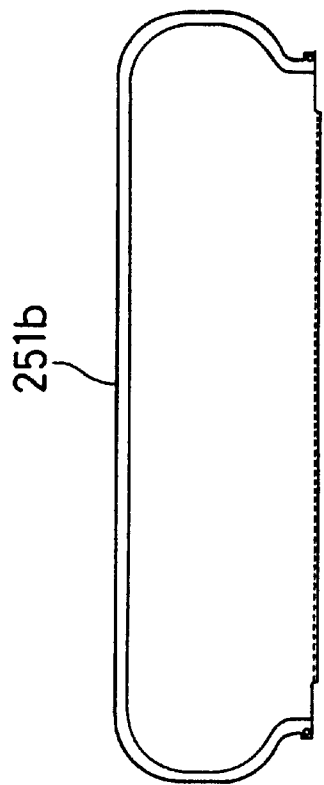
FIG. 17A is a plan view of a pressed plate 251a constructing a connecting pipe according to the fourth embodiment.
Figure 17B:
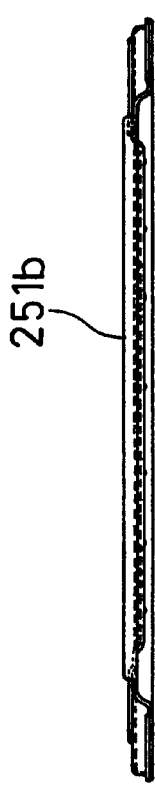
FIG. 17B is a side view of a pressed plate 251a constructing a connecting pipe according to the fourth embodiment.
Figure 17C:
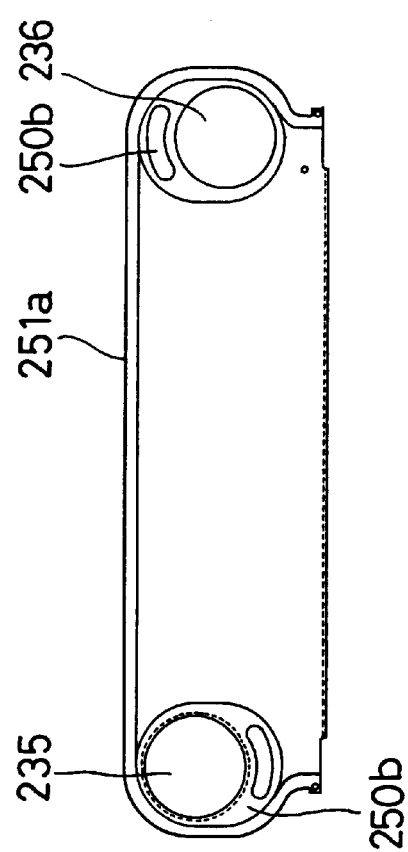
FIG. 17C is a plan view of a pressed plate 251b constructing a connecting pipe according to the fourth embodiment.
Figure 17D:
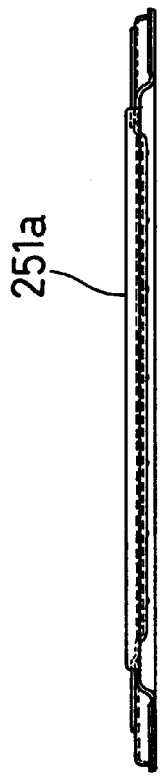
FIG. 17D is a side view of a pressed plate 251b constructing a connecting pipe according to the fourth embodiment.

A connecting pipe 251 is formed by stacking a pair of pressed plates 251a and 251b as shown in FIGS. 17A to 17D. FIG. 17A is a plan view of the pressed plate 251a adjacent to the radiator 204. FIG. 17B is a side view of the pressed plate 251a. FIG. 17C is a plan view of the pressed plate 251b not adjacent to the radiator to 204. FIG. 17D is a side view of the pressed plate 251b.

A refrigerant tank outlet 235 for sending out the vaporized refrigerant to the radiator 204 and a refrigerant tank inlet 236 for introducing the condensed refrigerant from the radiator 204 are formed in the pressed plate 251a.

Figure 16:
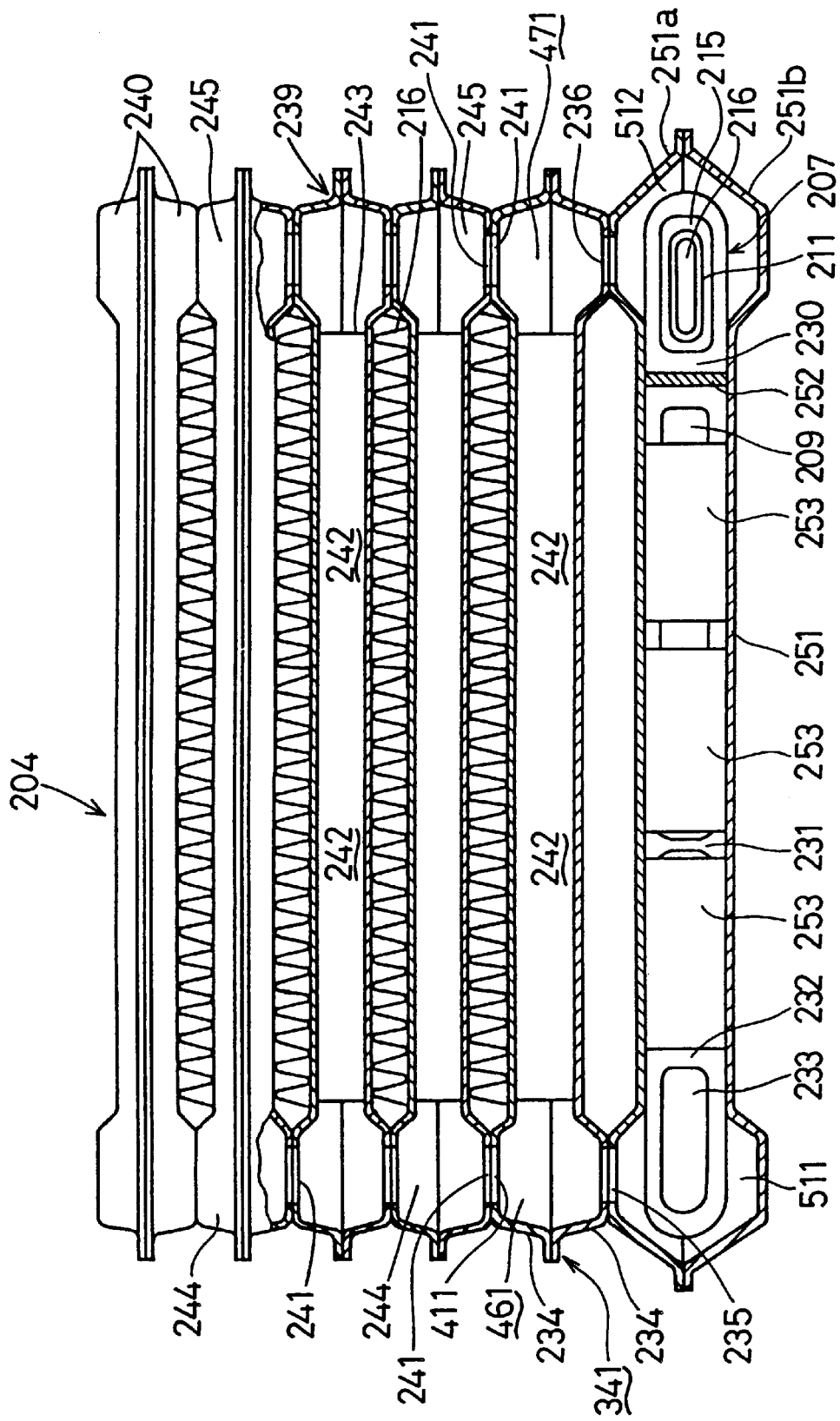
FIG. 16 is a sectional view of the cooling apparatus taken on the lines XVI—XVI in FIG. 13 according to the fourth embodiment of the present invention.

The connecting pipe 251 covers an upper end of the refrigerant tank 203, and an interior of the connecting pipe 251 is divided by partition walls 252 into an inflow chamber 511 communicating with the refrigerant tank outlet 235 and an outflow chamber 512 communicating with the refrigerant tank inlet 236. As shown in FIGS. 14 to 16, a plurality of inner fins 253 are disposed in the outflow chamber 512 of the connecting pipe 251, and are held by a plurality of positioning ribs 250a formed in the pressed plates 251a and 251b. The pressed plate 251a is attached to the radiator 204.

The radiator 204 is a so-called drawn cup type heat exchanger. The radiator 204 is formed by stacking a plurality of hollow radiating tubes 239.

Figure 18A:
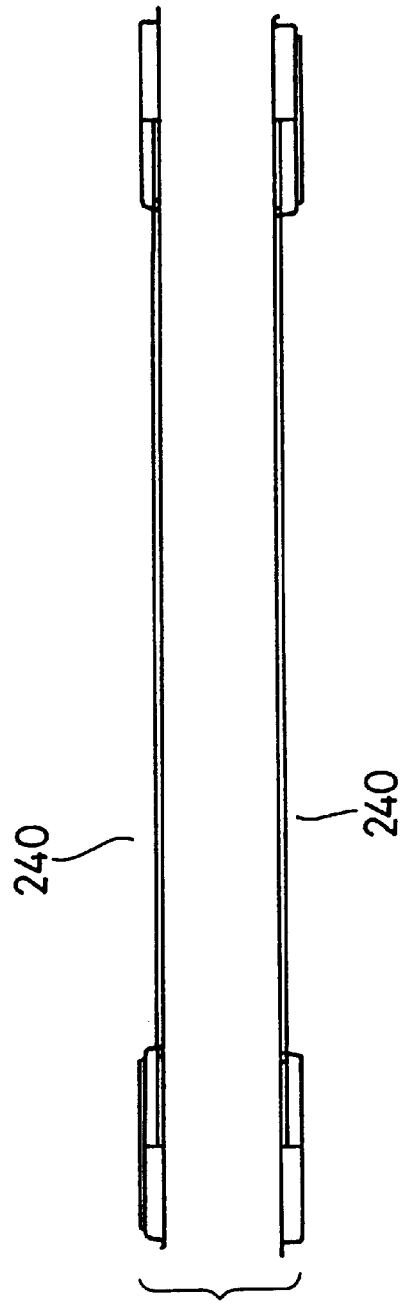
FIG. 18A is a side view of pressed plates 240 constructing a radiation tube according to the fourth embodiment.
Figure 18B:
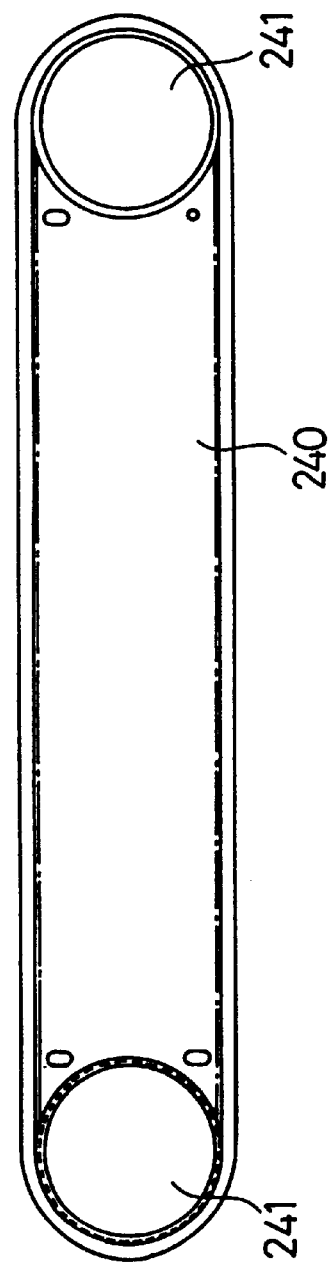
FIG. 18B is a plan view of the pressed plate 240 constructing the radiation tube according to the fourth embodiment.

The radiating tube 239 is formed by joining peripheral edge portions of a pair of the identical pressed plates 240 made of, for example, aluminum shown in FIGS. 18A and 18B.

As shown in FIG. 15, each radiating tube 239 forms therein a flat radiating passage 242 at an entire center portion thereof, and respective end portions form an inflow communicating chamber 244 (space connected to the refrigerant tank outlet 235) and an outflow communicating chamber 245 (space connected to the refrigerant tank inlet 236), respectively, each of which has a large-diameter. The inflow communicating chamber 244 and the outflow communicating chamber 245 are provided with the small-diameter openings 241 to communicate with the adjacent radiating tube 239.

Figure 19:
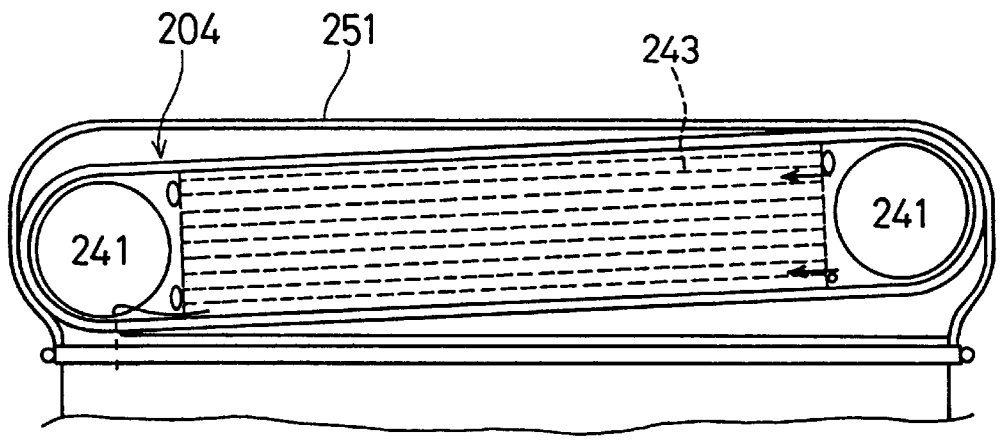
FIG. 19 is a part of a schematic illustration to explain the inside of a radiation passage 242 of the cooling apparatus according to the fourth embodiment.

As shown in FIG. 19, corrugated inner fins 243 made of thin aluminum plates are disposed in the radiating passages 242 of respective radiating tubes 239. The inner fin 243 has louvers formed by cutting and protruding to collect the condensed refrigerant downwardly.

The radiating tubes 239 are attached to the connecting pipe 251 while being inclined entirely such that the level of the inflow communicating chamber 244 is higher than that of the outflow communicating chamber 245 as shown in FIGS. 13 and 15. Ribs 250b formed in the plates 251a reinforce the connected portions between the connecting pipe 251 and the radiating tube 239.

As shown in FIG. 14, cooling fan 205, such as an axial-flow fan, is disposed on an upper surface of the radiator 204 to blow air vertically toward the radiator 204. The cooling fan 205 may be either a suction fan disposed at a downstream side of the radiator 204 or a forced draft fan disposed at an upstream side of the radiator 204. Furthermore, the cooling fan 205 may be a cross-flow fan and may be disposed in front of or behind the radiator 204.

A flat-tube-shaped inner pipe 211, which is extended from the outflow chamber 512 of the connecting pipe 251 to the inside of the end cap 222, is provided in the condensed liquid passage 210. The inner pipe 211 is made up of aluminum, and is formed separately from the refrigerant tank 203. The inner pipe 211 divides the condensed liquid passage 210 into a heat insulating passage 215 and a condensed refrigerant passage 216.

Figure 20:
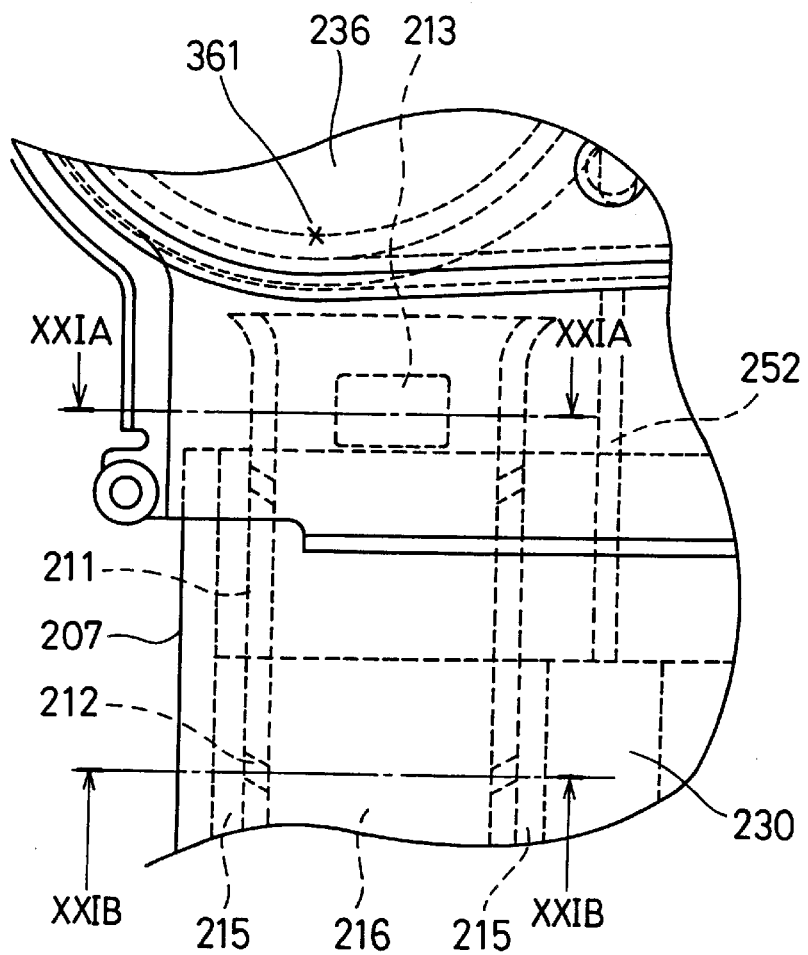
FIG. 20 is a part of enlarged view of the cooling apparatus shown in FIG. 15 according to the fourth embodiment.
Figure 21A:
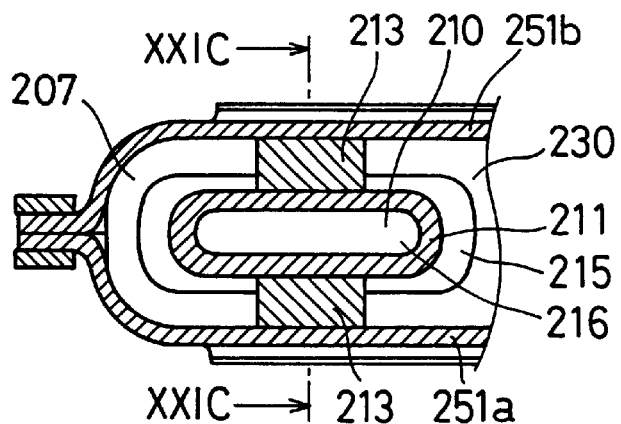
FIG. 21A is a part of sectional view of the cooling apparatus taken on the lines XXIA—XXIA in FIG. 20 according to the fourth embodiment.
Figure 21B:
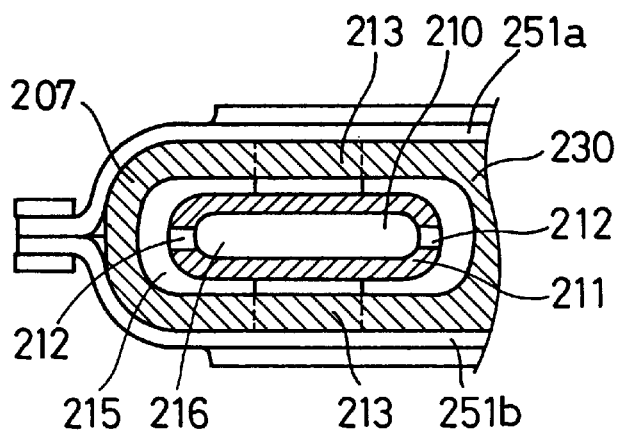
FIG. 21B is a part of sectional view of the cooling apparatus taken on the lines XXIB—XXIB in FIG. 20 according to the fourth embodiment.

As shown in FIGS. 20 and 21B, several holes 212 are formed in bent portions of the inner pipe 211. As shown in FIG. 20. each of the holes 212 is formed with an inclination such that its outer side is higher than its inner side. Intervals between the respective adjacent holes 212 may be identical. However, it is possible to arrange the interval such that it is gradually reduced or increased upwardly. Furthermore, diameters of the holes 212 may be identical. However, it is possible to arrange the diameter such that it is gradually reduced or increased upwardly.

The uppermost hole 212 is located above heat receiving area of the refrigerant tank 203 directly receives heat from IGBT modules 202, and is located below the radiator 204. Accordingly, the refrigerant liquid level under the operation (when IGBT modules 202 heat up) is higher than any of the IGBT modules 202 and lower than the radiator 204. Thus, condensed low temperature refrigerant returned from the radiator 204 is efficiently introduced into the inner pipe 211.

Figure 21C:
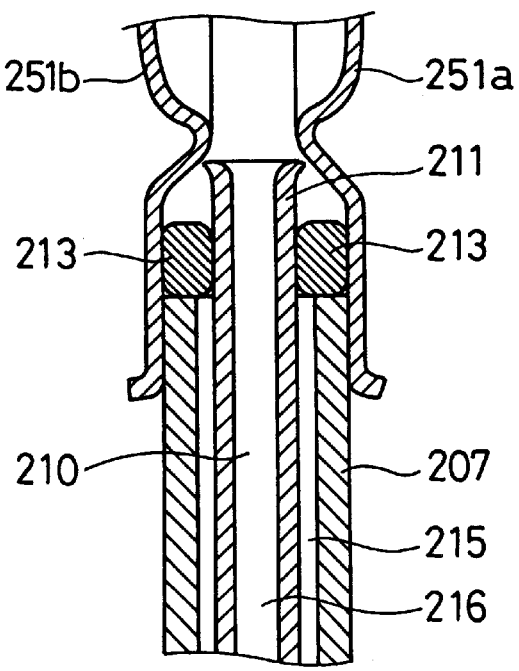
FIG. 21C is a part of sectional view of the cooling apparatus taken on the lines XXIC—XXIC in FIG. 21A according to the fourth embodiment.

FIG. 20 is an enlarged view around the upper portion of the condensed liquid passage 210 in FIG. 15. As shown in FIGS. 20 to 21C, the inner pipe 211 is supported and fixed by a pair of blocks 213. The block 213 is made of metal, such as aluminum, or ceramics or plastics, and has an angular or spherical shape. The block 213 supports the inner pipe 211 such that a part of the lower surface of the block 213 does not contact the upper surface of the extruded member 207, and one side surface of the block 213 contacts the inner wall of the plates 251a and 251b, and the other side surface of the block 213 contacts the inner pipe 211.

Although the lower end of the inner pipe 211 protrudes in the end cap 222, it is fixed by contacting the end cap 222. The lower end of the inner pipe 211 may be fixed by enlarging the opening of the lower end and securing the enlarged opening to the extruded member 207. The block 213 is easily fixed by brazing.

The inner pipe 211 is placed such that the lowest end portion 361 of the refrigerant tank inlet 236 is located at an area corresponding to the uppermost opening of the inner pipe 211. Accordingly, the condensed refrigerant is efficiently introduced to the inner pipe 211 from the refrigerant tank inlet 236. Furthermore, since the uppermost portion of the inner pipe 211 is flared as shown in FIG. 20, the condensed refrigerant is efficiently introduced to the inner pipe 211.

Since the upper surface of the block 213 is approximately located at the boundary between straight portion and the flared portion of the inner pipe 211, the inner pipe 211 is easily fixed in the longitudinal direction.

Operations of the fourth embodiment will now be described.

The refrigerant heated by heat generated by and transferred from IGBT modules 202 boils and ascends as bubbles through the vapor passages 209. After flowing through the tank outlet 235 into the inflow chamber 511 of the connecting pipe 251, the vaporized refrigerant flows from the inflow chamber 511 into the outflow passages, i.e., the inflow return chamber 461 and the inflow communicating chambers 244, and is distributed to the radiating passages 242 of the radiating tubes 239. The vaporized refrigerant flowing through the radiating passages 242 condenses on the inner surfaces of the radiating passages 242 and the surfaces of the inner fins, which are cooled by air blown by the cooling fan 205 (see FIG. 14), to release the latent heat of condensation.

The condensed refrigerant becomes droplets and flows along the bottom surfaces of the radiating passages 242 into the outflow passages, that is, the outflow communicating chambers 245 and the outflow return chamber 471. Then, the condensed refrigerant flows into the refrigerant tank 203 from the outflow passages through the inflow chamber of the connecting pipe 251 and the proximity of the lowest end 361 of the tank inlet 236 of the refrigerant tank 203.

Most of, but preferably all of, the condensed low temperature refrigerant flowed into the refrigerant tank 203 flows into the inner pipe 211 having an opening area right beneath the lowest end 361. After flowing down through the inner pipe 211, the condensed low temperature refrigerant is sent into the end cap 222 through the opening area around the lowest end of the inner pipe 211, and is supplied to respective vapor passages 209 through the lower connecting passage 238 formed in the end cap.

Although the heat generated by the IGBT modules 202 is transmitted to the condensed liquid passage 210 via the partition wall 230 and the outer wall of the extruded member 207 to cause the bubbles, the inner pipe 211 is located in the condensed liquid passage 210 keeping a certain distance from the partition wall 230 for flowing the condensed low temperature refrigerant therein. Accordingly, there is no bubble in the inner pipe 211.

In other words, according to the fourth embodiment of the present invention, the inner pipe 211 is provided as a separator in the condensed liquid passage 210 to divide the condensed liquid passage 210 into the heat insulating passage 215 and the condensed refrigerant passage 216. Accordingly, the condensed refrigerant passage 216 is prevented from bubbles by the heat insulating passage 215 even if the heat is transmitted to the condensed liquid passage 210 from the vapor passage 209.

Furthermore, the inner pipe 211 is formed separately from the refrigerant tank 203 and is inserted into the condensed liquid passage 210, it is not necessary to form an extra support wall to make the heat insulating passage 215. Accordingly, the decrease of the extrusion performance caused by asymmetric structure of the cross section of the refrigerant tank 203 is prevented. Since it is not necessary to form the extra support wall, the cooling apparatus is not increased in size. Thus, the boiling of the refrigerant in the condensed liquid passage 210 is prevented without decreasing the extrusion performance and without increasing the size of the apparatus.

Furthermore, since the holes 212, formed with an inclination such that its outer side is higher than its inner side, are formed in the inner pipe 211, the bubbles generated in the heat insulating passage 215 is prevented from entering the condensed refrigerant passage 216. It is to be noted that the bubbles generated between the partition wall 230 and the inner pipe 211 in the condensed liquid passage 210, and bubbles generated in the inner pipe 211 and released into the condensed liquid passage 210 via holes 212 ascend to the above the refrigerant liquid level via the space formed between the uppermost portion of the inner pipe 211 and the inner wall of the extruded member 207. Then the bubbles are condensed again in the refrigerant tank 203 or the radiator 204, and introduced to the inner pipe 211 in the refrigerant tank 203.

Because the separator has a pipe shape, the condensed liquid passage 210 is easily separated into the heat insulating passage 215 and the condensed refrigerant passage 216.

Because a part of the inner pipe 211 is protruded upwardly higher than the upper surface of the refrigerant tank 203, and because the block 213 is provided between the inner pipe 211 and the upper surface of the refrigerant tank 203, the inner pipe 211 is not only fixed against the condensed liquid passage 210 but also constructed such that the heat transmission from the refrigerant tank 203 is minimized. Accordingly, the generation of the bubbles is minimized.

(Fifth Embodiment)

A fifth embodiment of the present invention will now be described with reference to FIGS. 22 to 23C.

In the fifth embodiment of the present invention, components which are substantially the same to those in the fourth embodiment are assigned the same reference numerals. The major difference between the fourth embodiment and the fifth embodiment is the structural difference of the inner pipe 211. Therefore, detailed descriptions for components other than the inner pipe 211 are obviated.

Figure 22:
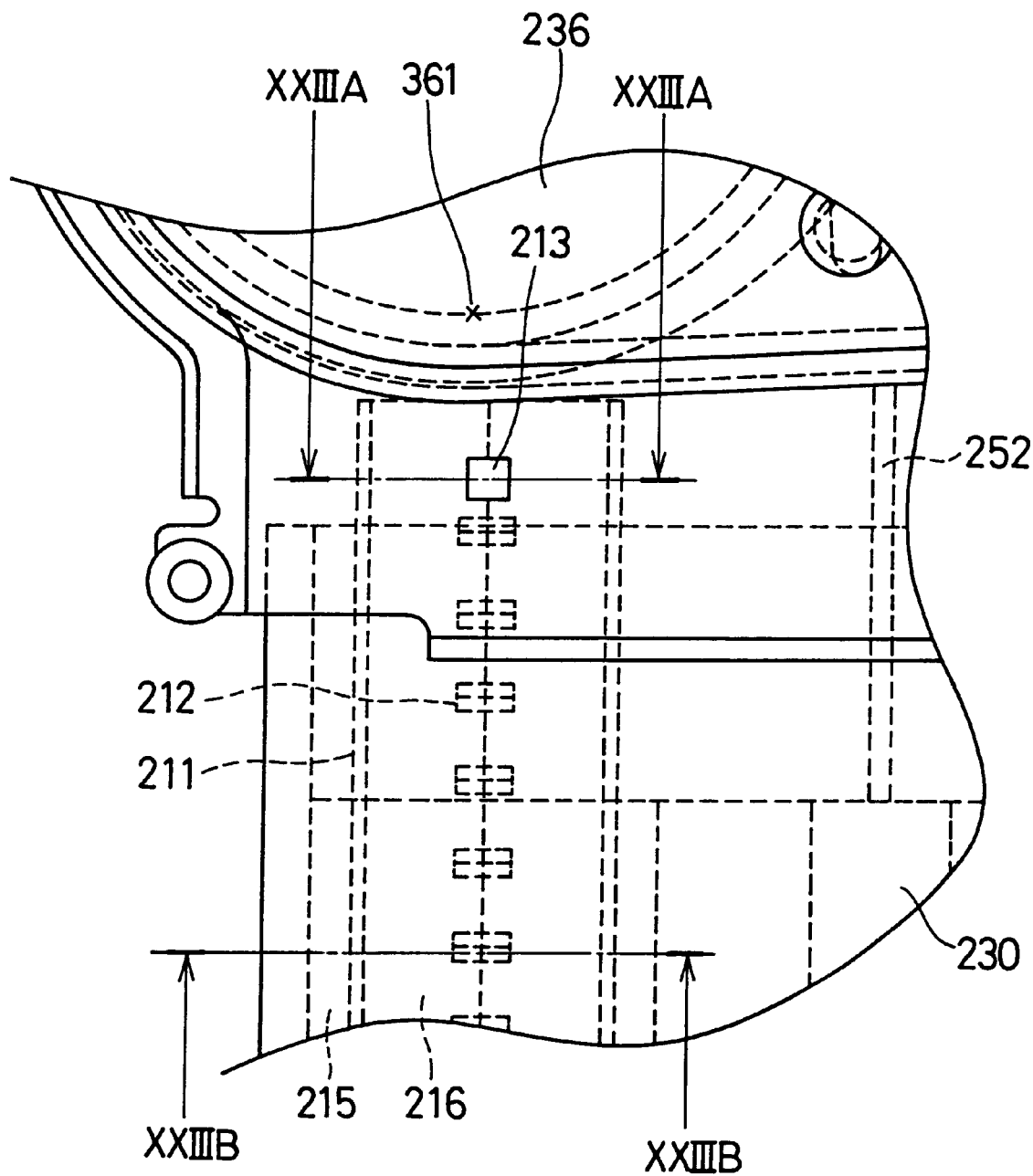
FIG. 22 is a part of enlarged view of a cooling apparatus according to a fifth embodiment of the present invention.
Figure 23A:
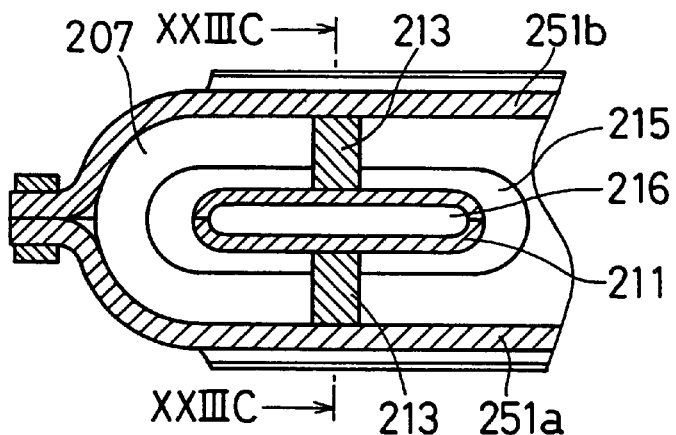
FIG. 23A is a part of sectional view of the cooling apparatus taken on the lines XXIIIA—XXIIIA in FIG. 22 according to the fifth embodiment.
Figure 23B:
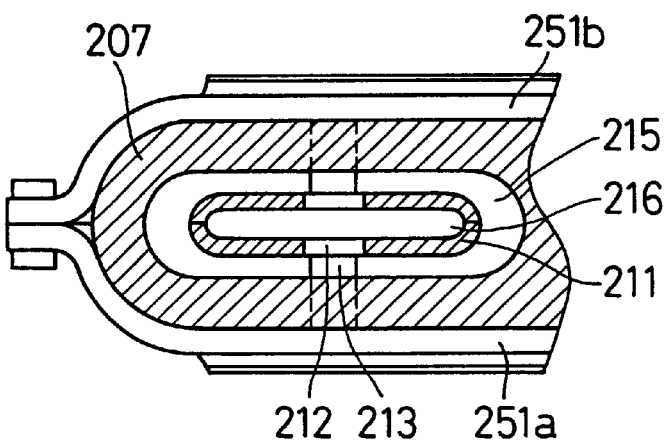
FIG. 23B is a part of sectional view of the cooling apparatus taken on the lines XXIIIB—XXIIIB in FIG. 22 according to the fifth embodiment.
Figure 23C:
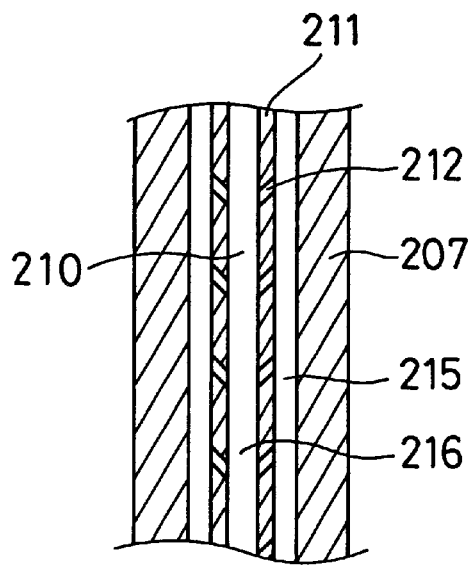
FIG. 23C is a part of sectional view of the cooling apparatus taken on the lines XXIIIC—XXIIIC in FIG. 23A according to the fifth embodiment.

As shown in FIGS. 22 to 23C, a plurality of holes 212 are formed in straight portions of the inner pipe 211. Each of the holes 212 is formed with an inclination such that its outer side is higher than its inner side. Intervals between the respective adjacent holes 212 may be identical. However, it is possible to arrange the interval such that it is gradually reduced or increased upwardly. Furthermore, diameters of the holes 212 may be identical. However, it is possible to arrange the diameter such that it is gradually reduced or increased upwardly.

According to the fifth embodiment, because the respective holes 212 are formed in the straight portions of the inner pipe 211, distance between the partition wall 230 and the respective holes 212 is longer than that of the fourth embodiment. Accordingly, the inner pipe 211 is securely prevented from the bubbles when the bubbles are generated in the condensed liquid passage 210 near the surface of the partition wall 230.

(Sixth Embodiment)

Figure 24:
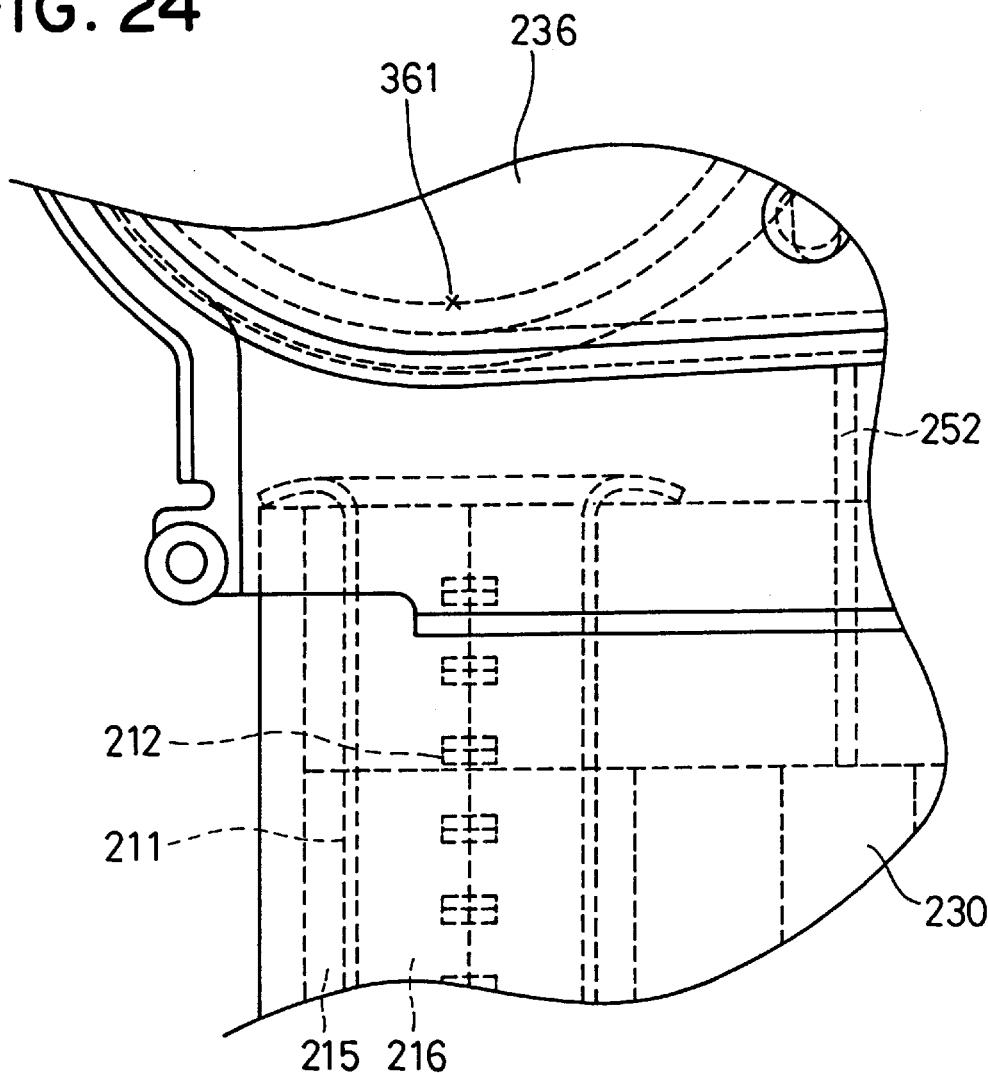
FIG. 24 is a part of enlarged view of a cooling apparatus according to a sixth embodiment of the present invention.

A sixth embodiment of the present invention will now be described with reference to FIGS. 24 to 25B.

In the sixth embodiment of the present invention, components which are substantially the same to those in the fourth and fifth embodiments are assigned the same reference numerals. The major difference between the fifth embodiment and the sixth embodiment is the structural difference of the inner pipe 211 and the way of fixing the inner pipe 211. Therefore, detailed descriptions for components other than the inner pipe 211 are obviated.

Figure 25A:
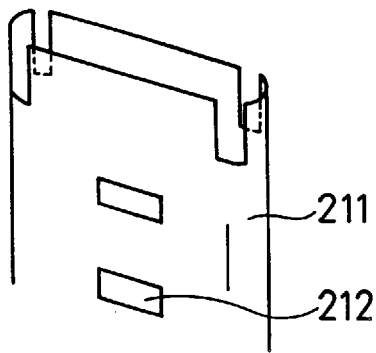
FIGS. 25A and 25B are perspective views to explain the structure of an inner pipe 211 of the cooling apparatus shown in FIG. 24 according to the sixth embodiment.
Figure 25B:
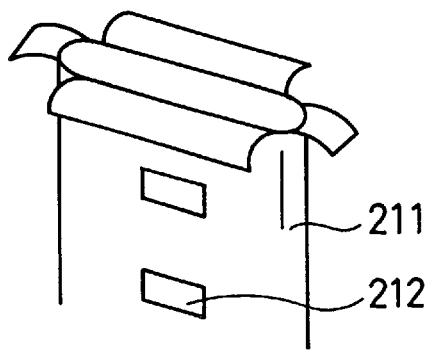

In the sixth embodiment, a part of the uppermost portion of the inner pipe 211 is notched as shown in FIG. 25A, and is bent outwardly as shown in FIG. 25B. Although there are four notches in this embodiment, the number of the notches may be less than four, or may be greater than four, and even numbers is preferable for making the inner pipe 211 symmetric.

The inner pipe 211 is fixed in the condensed liquid passage 210 by contacting the bent portions with the upper end surface of the extruded member 207. Accordingly, the blocks 213 in the fourth and the fifth embodiments are obviated.

According to the sixth embodiment, the top end portion of the inner pipe 211 is flared similarly to the one in the fourth embodiment. Accordingly, the condensed refrigerant flowed from the refrigerant tank inlet 236 is effectively introduced into the inner pipe 211. Furthermore, since the uppermost portion of the inner pipe 211 is notched and bent outwardly, heat transmission from the refrigerant tank 203 to the inner pipe 211 is reduced, and the generation of the bubbles is reduced.

(Seventh Embodiment)

A seventh embodiment of the present invention will now be described with reference to FIGS. 26A to 26C.

In the seventh embodiment of the present invention, components which are substantially the same to those in the fourth embodiment is assigned the same reference numerals. The major difference between the fourth embodiment and the seventh embodiment is the structural difference of the inner pipe 211 and the way of fixing the inner pipe 211. Therefore, detailed descriptions for components other than the inner pipe 211 are obviated.

Figure 26A:
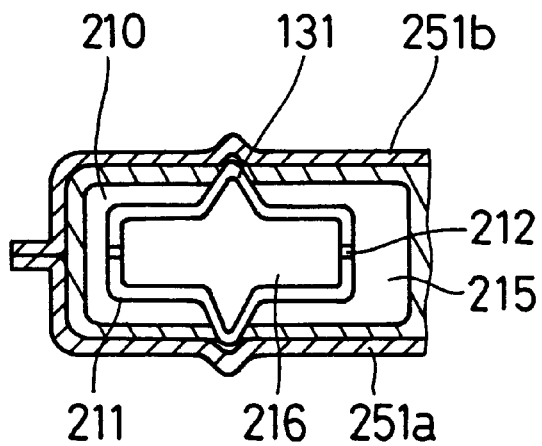
FIG. 26A is an enlarged cross section of a condensed liquid passage 210 according to a seventh embodiment of the present invention.
Figure 26B:
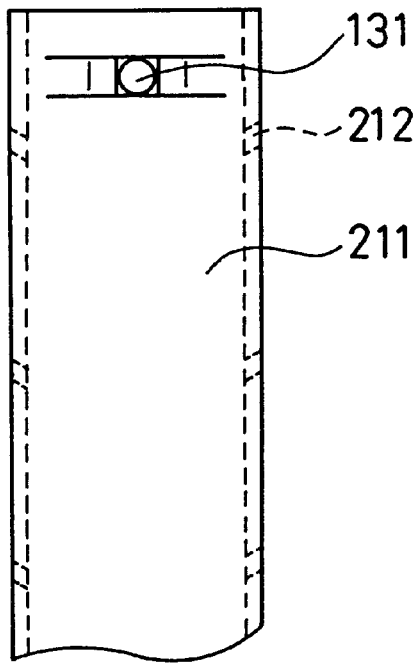
FIG. 26B is an enlarged side view of a part of the inner pipe 211 according to the seventh embodiment.
Figure 26C:
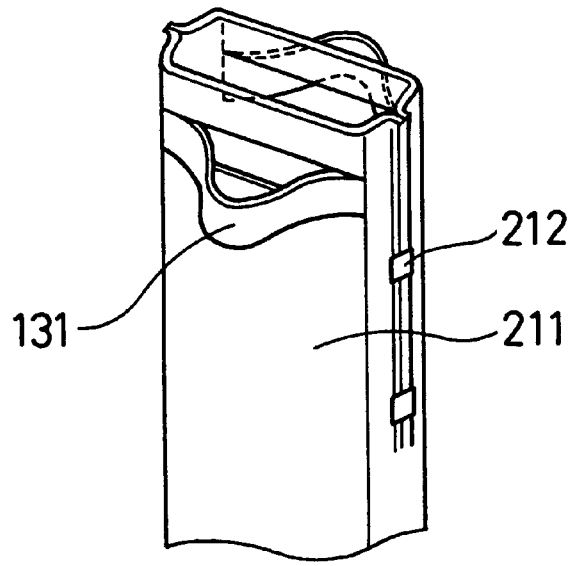
FIG. 26C is an enlarged perspective view of the part of the inner pipe 211 according to the seventh embodiment.

In the seventh embodiment, as shown in FIGS. 26A to 26C, the inner pipe 211 is formed by joining a pair of pressed plates having notches on their end portions. Protrusions 131 are formed at slightly below the uppermost portion of the inner pipe 211 such that the protrusions 131 protrude outwardly.

The lower end surface of the protrusion 131 contacts with the uppermost surface of the extruded member 207. Accordingly, the inner pipe 211 is fixed in its longitudinal direction in the condensed liquid passage 210. The inner pipe 211 is also fixed in its transverse direction in the condensed liquid passage 210 because the peak of the protrusion 131 makes a contact with the inner wall of the pressed plates 251a and 251b.

According to the seventh embodiment of the present invention, the manufacturing cost is reduced because the inner pipe 211 is fixed by the protrusions 131.

(Eighth Embodiment)

An eighth embodiment of the present invention will now be described with reference to FIGS. 27A to 29B.

In the eighth embodiment of the present invention, components which are substantially the same to those in the fourth embodiment is assigned the same reference numerals. The major difference between the fourth embodiment and the eighth embodiment is the structural difference of the condensed liquid passage 210. Therefore, detailed descriptions for components other than the condensed liquid passage 210 are obviated.

Although in the fourth through seventh embodiments the inner pipe 211 is formed inside the condensed liquid passage 210, a dividing plate 214 is provided in the condensed liquid passage 210 as a separator to divide the condensed liquid passage 210 instead of the inner pipe 211 in the eighth embodiment. In other words, the boiling of the refrigerant (the bubble) is prevented by forming a condensed refrigerant passage 216 with keeping certain distance from the partition wall 230 in the condensed liquid passage 210.

Figure 27A:
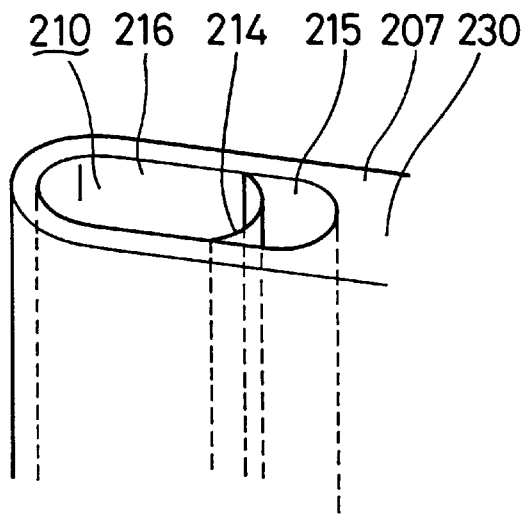
FIG. 27A is an enlarged perspective view of a part of condensed liquid passage 210 according to an eighth embodiment of the present invention.
Figure 27B:
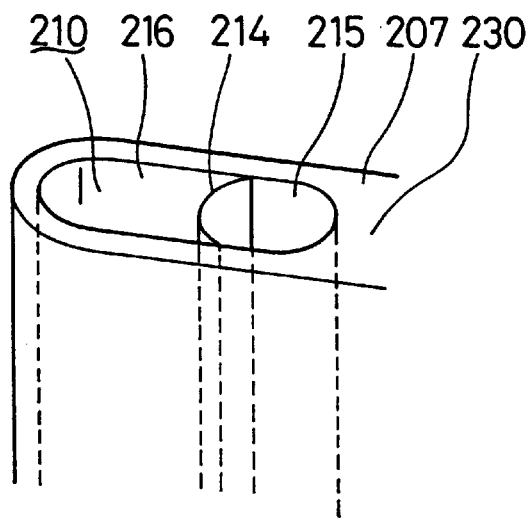
FIGS. 27B–27D are enlarged perspective views of a part of a cooling apparatus according to variations of the eighth embodiment.

As shown in FIG. 27A, the curved dividing plate 214 is a thin plate separately formed from the refrigerant tank 203. The dividing plate 214 divides the condensed liquid passage 210 into the heat insulating passage 215 adjacent to the vapor passage 209 and the condensed refrigerant passage 216. The dividing plate 214 is curved such that it protrudes toward the partition wall 230 as shown in FIG. 27A. However, it may be curve oppositely as shown in FIG. 27B.

Accordingly, the dividing plate 214 is easily fixed to the inner wall of the condensed liquid passage 210 by the elastic force of the dividing plate 214. It is preferable to braze the contact portions between the dividing plate 214 and the inner wall of the condensed liquid passage 210. The uppermost end of the dividing plate 214 is equal to or higher than the uppermost end of the extruded member 207, and the lower end of the dividing plate 214 is extended to the inside of the end cap 222.

Figures 28A, 28B, 28C:
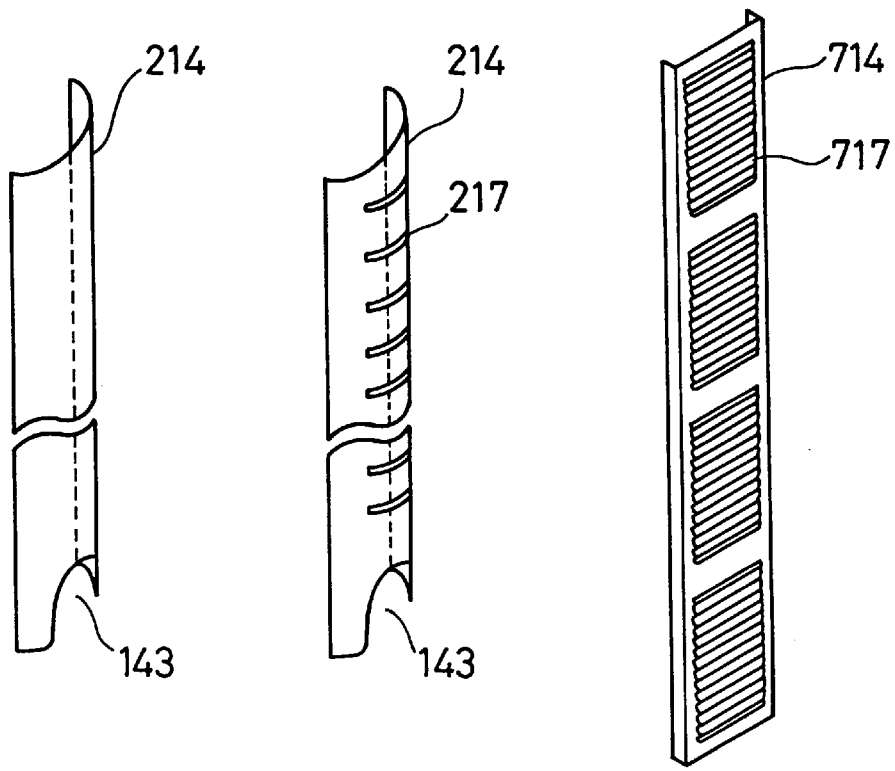
FIGS. 28A and 28B are perspective views showing a dividing plate 214 according to the eighth embodiment.
FIG. 28C is a perspective view showing a dividing plate 714 according to a modification of the eighth embodiment.

FIGS. 28A and 28B are schematic illustrations of the dividing plate 214 of the eighth embodiment. As shown in FIGS. 28A and 28B, a communication hole 143 is fomed at the lower end of the dividing plate to facilitate the movement of the condensed refrigerant.

The dividing plate 214 further has several holes 217 (corresponding to holes 212 in the fourth embodiment) to communicate the heat insulating passage 215 with the condensed refrigerant passage 216 as shown in FIG. 28B. Each of the holes 217 is notched and bent so as to form it with an inclination such that the condensed refrigerant passage 216 side is lower than the heat insulating passage 215 side.

Figure 27C:
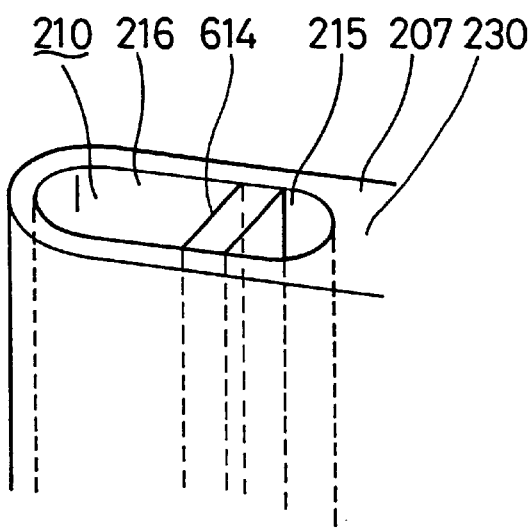

The dividing plate 214 may be replaced by a rectangular parallelopiped dividing member 614 as shown in FIG. 27C. According to the eighth embodiment, the dividing plate 214 or dividing member 614 functions as the separator, the condensed liquid passage 210 is easily divided into the heat insulating passage 215 and the condensed refrigerant passage 216.

Figure 27D:
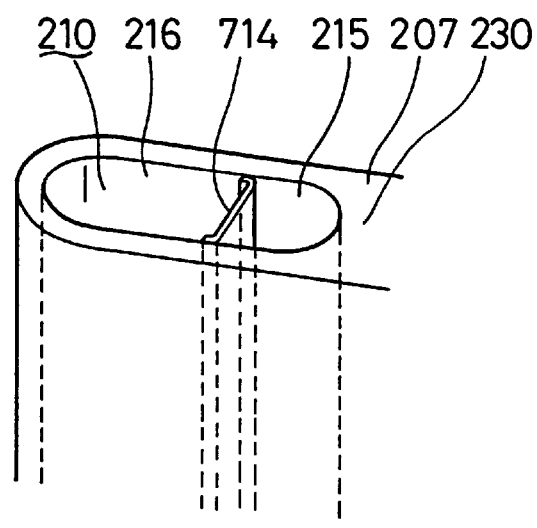

Furthermore, the dividing plate 214 may be replaced by a dividing plate 714 as shown in FIGS. 27D and 28C. The dividing plate 714 has a bent side edge on both sides. It is preferable to fix the dividing plate 714 to the inner wall of the condensed liquid passage 210 by brazing. As shown in FIG. 28C, the dividing plate 714 also has holes 717 similarly to the holes 217 in FIG. 28B such that the condensed refrigerant passage 216 side is lower than the heat insulating passage 215 side.

Figure 29A:
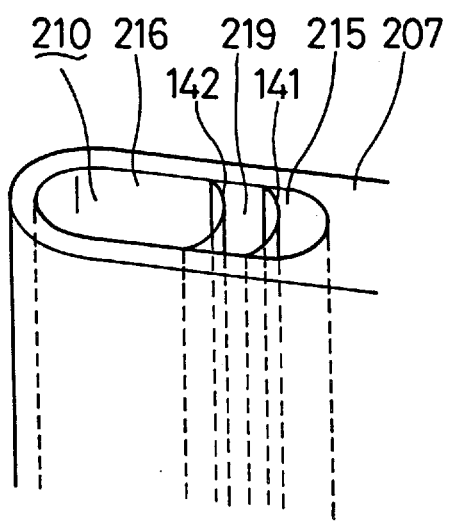
FIGS. 29A and 29B are enlarged perspective views of a part of cooling apparaus according to variations of the eighth embodiment.

In the eighth embodiment, the dividing plate 214 may be plural as shown in FIG. 29A.

According to a variation of the eighth embodiment shown in FIG. 29A, a first dividing plate 141 and a second dividing plate 142 are provided in the condensed liquid passage 210 to form a first heat insulating passage 215 adjacent to the partition wall 230, a second heat insulating passage 219, and a condensed refrigerant passage 216. Accordingly, the heat insulating performance is improved, and the generation of the bubble is prevented.

Figure 29B:
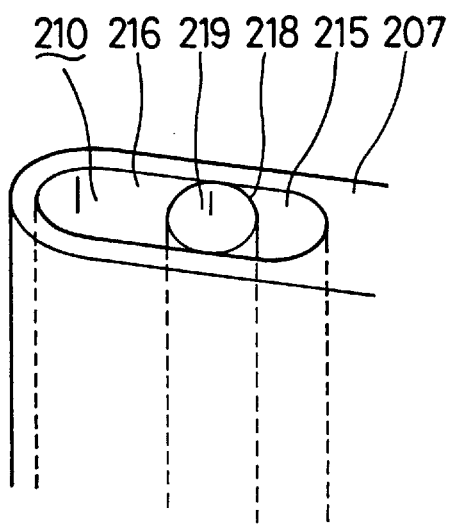
Figure 30:
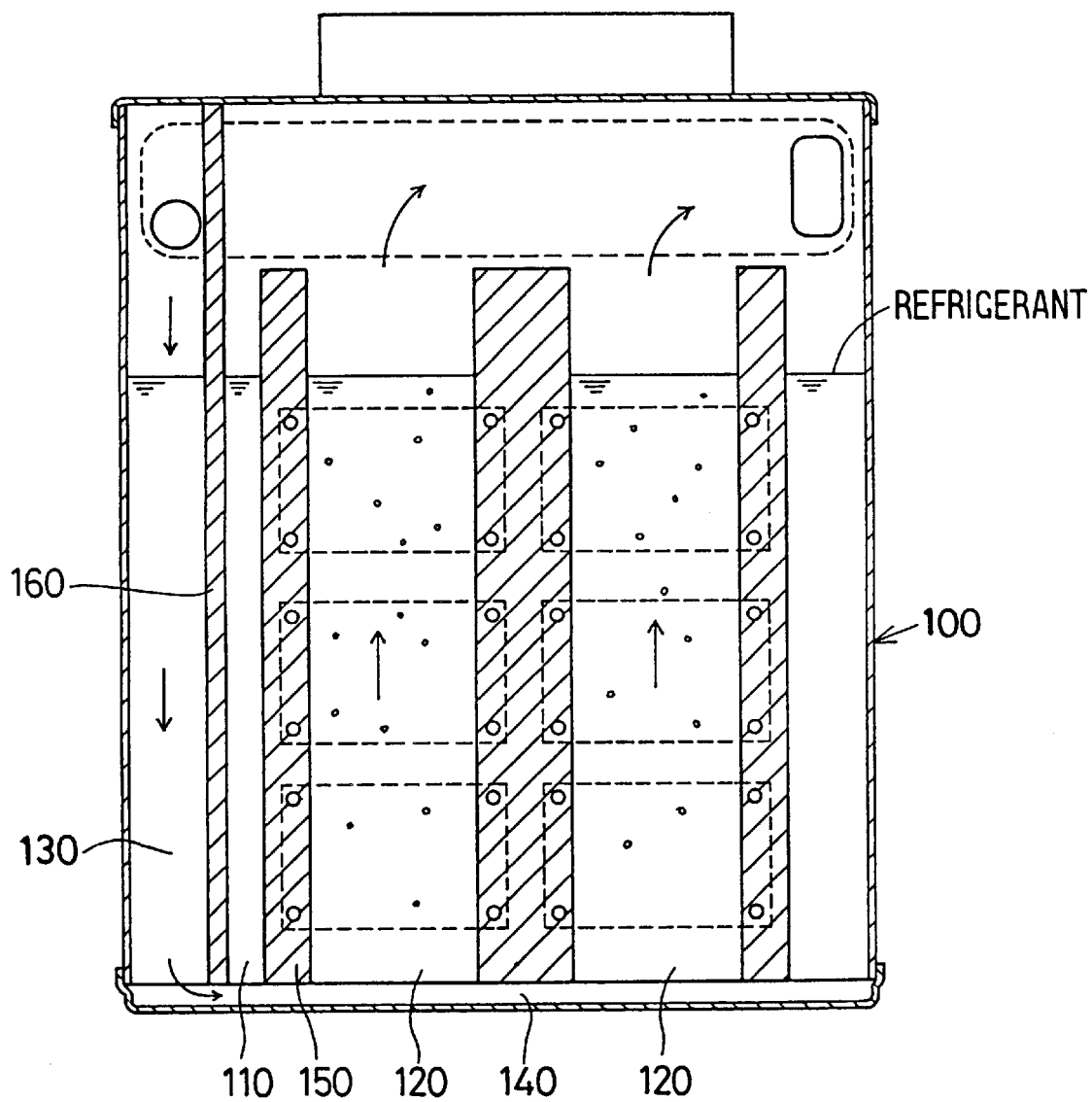
FIG. 30 is a longitudinal sectional view of a refrigerant tank according to a conventional cooling apparatus.

According to another variation of the eighth embodiment shown in FIG. 29B, a pipe-shaped dividing plate 218 is provided in the condensed liquid passage 210 to form the first heat insulating passage 215 adjacent to the partition wall 230, the second heat insulating passage 219, and the condensed refrigerant passage 216. Accordingly, the heat insulating performance is improved, and the generation of the bubble is prevented.

In these variations shown in FIGS. 29A and 29B, it is possible to form holes 217 and/or communication hole 143 in the dividing plates 141, 142, and 218.

Although the present invention has been fully described in connection with the preferred embodiments thereof with reference to the accompanying drawings, it is to be noted that various changes and modifications will become apparent to those skilled in the art. Such changes and modifications are to be understood as being included within the scope of the present invention as defined in the appended claims.

What is claimed is:

1. A cooling apparatus using boiling and condensing refrigerant for cooling an exothermic device, comprising:

a refrigerant tank for storing liquid refrigerant which is partially boiled and vaporized into gaseous refrigerant by heat transmitted from the exothermic device; and a radiator communicated to said refrigerant tank to receive said gaseous refrigerant from said refrigerant tank, for radiating heat of said gaseous refrigerant to an outside of said radiator to condense said gaseous refrigerant, and for returning said condensed refrigerant to said refrigerant tank, wherein;

said refrigerant tank includes a refrigerant chamber in which said liquid refrigerant is vaporized by receiving heat transmitted from the exothermic device, a condensed liquid passage in which said condensed refrigerant flows, a heat insulating passage provided between said refrigerant chamber and said condensed liquid passage for reducing heat transmission from said refrigerant chamber to said condensed liquid passage, and a communication passage provided at a bottom of said refrigerant tank for communicating said refrigerant chamber, said condensed liquid passage, and said heat insulating passage; and said refrigerant tank includes a vapor reverse flow reducing member provided between said heat insulating passage and said communication passage for reducing a flow of said gaseous refrigerant from said heat insulating passage to said communication passage.

2. A cooling apparatus according to claim 1, wherein said vapor reverse flow reducing member is a plate having a hole such that said liquid refrigerant passes through said hole.

3. A cooling apparatus according to claim 2, wherein an area of said hole of said vapor reverse flow reducing member is in a range from 20% to 80% of an opening area of said heat insulating passage at a connection between said heat insulating passage and said vapor reverse flow reducing member.

4. A cooling apparatus according to claim 2, wherein a diameter of said hole is in a range from 3 mm to 7 mm.

* * * * *